(12) United States Patent
Morino et al.

(10) Patent No.: US 11,545,478 B2
(45) Date of Patent: Jan. 3, 2023

(54) DISPLAY DEVICE

(71) Applicant: SHARP KABUSHIKI KAISHA, Sakai (JP)

(72) Inventors: Shinya Morino, Sakai (JP); Masanao Nakui, Sakai (JP); Kenji Saimura, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 83 days.

(21) Appl. No.: 17/232,858

(22) Filed: Apr. 16, 2021

(65) Prior Publication Data
US 2021/0335770 A1    Oct. 28, 2021

(30) Foreign Application Priority Data

Apr. 27, 2020 (JP) ............................ JP2020-078419
Feb. 10, 2021 (JP) ............................ JP2021-019984

(51) Int. Cl.
*H01L 25/18* (2006.01)
*H01L 23/00* (2006.01)
(Continued)

(52) U.S. Cl.
CPC .......... *H01L 25/18* (2013.01); *G02F 1/13452* (2013.01); *G02F 1/133345* (2013.01); *H01L 23/3737* (2013.01); *H01L 51/5253* (2013.01); *H01L 24/29* (2013.01); *H01L 24/32* (2013.01); *H01L 27/3276* (2013.01); *H01L 2224/2929* (2013.01); *H01L 2224/32145* (2013.01)

(58) Field of Classification Search
CPC . H01L 25/18; H01L 23/3737; H01L 51/5253; H01L 24/29; H01L 24/32; H01L 27/3276; H01L 2224/2929; H01L 2224/32145; H01L 51/5256; H01L 51/529; H01L 51/5246; H01L 27/1244; G02F 1/133345; G02F 1/13452; G02F 2201/50; G02F 1/1345; G02F 1/13306; G02F 1/136286
See application file for complete search history.

(56) References Cited

U.S. PATENT DOCUMENTS

2015/0303219 A1* 10/2015 Tada .................. G02F 1/13454
257/386

FOREIGN PATENT DOCUMENTS

JP          2005-311019 A      11/2005

* cited by examiner

*Primary Examiner* — Kyoung Lee
(74) *Attorney, Agent, or Firm* — ScienBiziP, P.C.

(57) ABSTRACT

Provided is a display device capable of preventing or reducing short-circuiting in an alternating high and low temperature environment. The display device is configured to display an image in a display region and includes: an insulating substrate; conductive lines provided on the insulating substrate and extending from the display region to a frame region exterior to the display region; a driver provided in the frame region and connected to the conductive lines; an organic protective film overlapping the conductive lines and extending from the display region to a region between the display region and the driver; an anisotropic conductive film provided under the driver and covering an end of the organic protective film between the display region and the driver; and a moisture-proof resin film overlapping the anisotropic conductive film and covering the end of the organic protective film between the display region and the driver.

22 Claims, 10 Drawing Sheets

(51) Int. Cl.
*H01L 51/52* (2006.01)
*G02F 1/1333* (2006.01)
*G02F 1/1345* (2006.01)
*H01L 23/373* (2006.01)
*H01L 27/32* (2006.01)

(Back surface side)
Crack extending to TFT substrate

DISPLAY DEVICE

CROSS-REFERENCE TO RELATED APPLICATIONS

The present application claims priority under 35 U.S.C. § 119 to Japanese Patent Application No. 2020-078419 filed on Apr. 27, 2020 and Japanese Patent Application No. 2021-019984 filed on Feb. 10, 2021, the contents of which are incorporated herein by reference in their entirety.

BACKGROUND OF THE INVENTION

Field of the Invention

The following disclosure relates to display devices.

Description of Related Art

Various display devices such as liquid crystal display devices and organic electroluminescent (EL) display devices have been widely used as devices for displaying video (moving images and still images).

For example, liquid crystal display devices are display devices utilizing a liquid crystal composition for display. A typical display mode thereof is applying light from a backlight to a liquid crystal panel including a TFT substrate with thin-film transistors (TFTs), a counter substrate facing the TFT substrate, and a liquid crystal layer sealed between the TFT substrate and the counter substrate and applying voltage to the liquid crystal molecules in the liquid crystal layer to change the alignment state of the liquid crystal molecules, thereby controlling the amount of light transmitted. Such liquid crystal display devices are used in a variety of fields owing to their features such as a thin profile, light weight, and low power consumption.

Also, organic EL display devices include, for example, a TFT substrate with TFTs, organic EL elements provided on the TFT substrate and connected to the respective TFTs, an adhesive layer provided in a frame shape to surround the organic EL elements, and a sealing substrate covering the organic EL elements. Organic EL display devices for full-color display typically include organic EL elements in three colors of red (R), green (G), and blue (B) as subpixels, wherein these subpixels are arranged in a matrix pattern with three subpixels of the three respective colors defining one pixel. These organic EL elements are selectively controlled to emit light with the desired luminance, so that images are displayed.

The TFT substrate includes parallel gate lines and parallel source lines intersecting the gate lines with an insulating film in between. At each intersection of a source line and a gate line is provided a TFT as a switching element. A source driver electrically connected to the source lines and a gate driver electrically connected to the gate lines drive and control the liquid crystal display device.

Drivers such as a source driver for driving a liquid crystal display device include semiconductor chips. A technology relating to semiconductor chips is disclosed in, for example, JP 2005-311019 A. This document describes a structure in which a wire-bonded portion on the upper surface of a semiconductor chip, excluding at least the ends thereof, is coated for reinforcement with an epoxy-based resin having a low coefficient of thermal expansion, and the epoxy-based resin is sealed with an epoxy-based filling resin having a similar coefficient of linear expansion to solder.

BRIEF SUMMARY OF THE INVENTION

Liquid crystal display devices for in-vehicle use as a whole generate a large amount of heat because the drivers generate more heat due to the higher definition and the light sources generate more heat due to the higher luminance (increased number of light sources). Meanwhile, liquid crystal display devices for in-vehicle use today are desired to exhibit high performance in a reliability test. The reliability test is, for example, a thermal cycle endurance (TCE) test in which a liquid crystal display device for in-vehicle use is exposed to alternating high and low temperature environments for a period longer than 1800 hours in total. This TCE test, which is run for a period longer than 1800 hours, is performed based on the assumption that a vehicle can be driven for 15 years, 300,000 km, and 8,000 hours. Vehicles will actually be required by the end users to have such durability. However, the TCE test has revealed that liquid crystal display devices for in-vehicle use causes a short circuit fault after 1200 hours, with a crack in conductive lines on the TFT substrate and the protective layer covering these lines.

Such a crack can occur in organic EL display devices as well as liquid crystal display devices. The crack is presumed to occur based on the following mechanism. The mechanism is described using a liquid crystal display device of a comparative embodiment as an example. FIG. 15 is a schematic cross-sectional view of a frame region in a liquid crystal display device of a comparative embodiment in a state where a moisture-proof resin film of the liquid crystal display device is cracked. FIG. 16 is an enlarged schematic cross-sectional view of the region surrounded by the dotted line in FIG. 15. FIG. 17 is a photograph showing the state where a conductive line in the liquid crystal display device of the comparative embodiment is short-circuited.

A liquid crystal display device 1R of a comparative embodiment includes, as shown in FIG. 15, a display region 10A that displays an image and a frame region 10B surrounding the display region 10A. The liquid crystal display device 1R also includes, as shown in FIG. 15, an insulating substrate 110, source lines 141 provided on the insulating substrate 110 and extending from the display region 10A to the frame region 10B exterior to the display region 10A, and a source driver 300 provided in the frame region 10B and connected to the source lines 141, an organic protective film 160 overlapping the source lines 141 and extending from the display region 10A to a region 10C between the display region 10A and the source driver 300, and a moisture-proof resin film 500 covering an end 161 of the organic protective film 160 between the display region 10A and the source driver 300. An inorganic film 150 and the organic protective film 160 covering the source lines 141 are also referred to as protective layers.

When the moisture-proof resin film 500 in the comparative embodiment hardened due to oxidative deterioration by heat is exposed to low temperature, a crack 500X occurs in the moisture-proof resin film 500 as shown in FIG. 16, applying large stress to the base. This breaks film(s) below the moisture-proof resin film 500 from the surface toward the inside. Thus, presumably, the crack as shown in FIG. 16 breaks the source lines 141 and the protective layers covering the source lines 141, whereby the source lines indicated by the white arrows in FIG. 17 are short-circuited.

JP 2005-311019 A describes injection of a filling resin to cover all the components inside the case. In this case, deterioration of the filling resin is selectively accelerated in portions with increasing temperature, and when the filling resin is cooled and cracked, the resin applies large stress to the base. Such a crack in the filling resin develops faster under an alternating high and low temperature condition than under a constant temperature condition, which leads to a reliability issue in practical use.

In response to the above issues, the present invention aims to provide a display device capable of preventing or reducing short-circuiting in an alternating high and low temperature environment.

The present inventors found that the crack 500X in the moisture-proof resin film 500 in the liquid crystal display device 1R of the comparative embodiment occurs when the following three conditions (Condition 1) to (Condition 3) are satisfied.

(Condition 1) The end 161 of the organic protective film 160 (e.g., acrylic resin film) is covered with the moisture-proof resin film 500.

(Condition 2) Heat generated by the source driver 300 and the light source in the liquid crystal display device 1R of the comparative embodiment oxidatively deteriorates and hardens the moisture-proof resin film 500.

(Condition 3) The hardened moisture-proof resin film 500 causes a thermal stress at low temperature.

In addition, the present inventors found that providing an anisotropic conductive film between the end of the organic protective film and the moisture-proof resin film or providing an epoxy-based resin film between the end of an acrylic resin film and a styrene-butadiene-based resin film can avoid (Condition 1) above to prevent or reduce short-circuiting. The inventors also found that not covering at least part of the top surface of the driver with the moisture-proof resin film can avoid (Condition 2) above to prevent or reduce short-circuiting. Furthermore, the inventors found that providing conductive lines by bypassing a site where the moisture-proof resin film causes a thermal stress at low temperature can result in provision of the conductive lines away from a site where a crack occurs due to (Condition 3) above, preventing or reducing short-circuiting. These techniques solve the above issues, and thereby the inventors completed the present invention.

(1) One embodiment of the present invention is directed to a display device configured to display an image in a display region, including: an insulating substrate; conductive lines provided on the insulating substrate and extending from the display region to a frame region exterior to the display region; a driver provided in the frame region and connected to the conductive lines; an organic protective film overlapping the conductive lines and extending from the display region to a region between the display region and the driver; an anisotropic conductive film provided under the driver and covering an end of the organic protective film between the display region and the driver; and a moisture-proof resin film overlapping the anisotropic conductive film and covering the end of the organic protective film between the display region and the driver.

(2) In an embodiment of the present invention, the display device includes the structure (1), the organic protective film is an acrylic resin film, the anisotropic conductive film is an epoxy-based resin film, and the moisture-proof resin film is a styrene-butadiene-based resin film.

(3) In an embodiment of the present invention, the display device includes the structure (1) or (2), and the moisture-proof resin film does not cover at least part of a top surface of the driver.

(4) In an embodiment of the present invention, the display device includes the structure (3), and the moisture-proof resin film does not cover 60% or more and 100% or less of an area of an entire top surface of the driver.

(5) In an embodiment of the present invention, the display device includes the structure (3) or (4), and further includes a heat dissipation sheet attached to a portion of the top surface of the driver not covered with the moisture-proof resin film.

(6) In an embodiment of the present invention, the display device includes the structure (1), (2), (3), (4), or (5), and with a direction from the driver to the display region being defined as a front direction, the conductive lines include a conductive line that extends from the driver to the display region by bypassing a diagonally front region diagonally in front of the driver and overlapping the end of the organic protective film.

(7) In an embodiment of the present invention, the display device includes the structure (6), the driver is provided along the display region, and the diagonally front region extends from a position 1.5 mm away from the driver to a position 2.5 mm away from the driver in a direction orthogonal to the direction from the driver to the display region.

(8) In an embodiment of the present invention, the display device includes the structure (6) or (7), the driver is provided along the display region, and the diagonally front region extends from a position 0.5 mm away from the driver to a position 1.0 mm away from the driver in the direction from the driver to the display region.

(9) In an embodiment of the present invention, the display device includes the structure (1), (2), (3), (4), (5), (6), (7), or (8), and further includes an inorganic film between the conductive lines and the organic protective film, wherein the inorganic film extends to an exterior region of the end of the organic protective film.

(10) Another embodiment of the present invention is directed to a display device configured to display an image in a display region, including: an insulating substrate; conductive lines provided on the insulating substrate and extending from the display region to a frame region exterior to the display region; a driver provided in the frame region and connected to the conductive lines; an acrylic resin film overlapping the conductive lines and extending from the display region to a region between the display region and the driver; an epoxy-based resin film covering an end of the acrylic resin film between the display region and the driver; and a styrene-butadiene-based resin film overlapping the epoxy-based resin film and covering the end of the acrylic resin film between the display region and the driver.

(11) In an embodiment of the present invention, the display device includes the structure (10), and the styrene-butadiene-based resin film does not cover at least part of a top surface of the driver.

(12) In an embodiment of the present invention, the display device includes the structure (11), and the moisture-proof resin film does not cover 60% or more and 100% or less of an area of an entire top surface of the driver.

(13) In an embodiment of the present invention, the display device includes the structure (11) or (12), and further includes a heat dissipation sheet attached to a portion of the top surface of the driver not covered with the styrene-butadiene-based resin film.

(14) In an embodiment of the present invention, the display device includes the structure (10), (11), (12), or (13), and with a direction from the driver to the display region being defined as a front direction, the conductive lines include a conductive line that extends from the driver to the display region by bypassing a diagonally front region diagonally in front of the driver and overlapping the end of the acrylic resin film.

(15) In an embodiment of the present invention, the display device includes the structure (14), the driver is provided along the display region, and the diagonally front region extends from a position 1.5 mm away from the driver to a position 2.5 mm away from the driver in a direction orthogonal to the direction from the driver to the display region.

(16) In an embodiment of the present invention, the display device includes the structure (14) or (15), the driver is provided along the display region, and the diagonally front region extends from a position 0.5 mm away from the driver to a position 1.0 mm away from the driver in the direction from the driver to the display region.

(17) In an embodiment of the present invention, the display device includes the structure (10), (11), (12), (13), (14), (15), or (16), and further includes an inorganic film between the conductive lines and the acrylic resin film, wherein the inorganic film extends to an exterior region of the end of the acrylic resin film.

(18) Yet another embodiment of the present invention is directed to a display device configured to display an image in a display region, including: an insulating substrate; conductive lines provided on the insulating substrate and extending from the display region to a frame region exterior to the display region; a driver provided in the frame region and connected to the conductive lines; an organic protective film overlapping the conductive lines and extending from the display region to a region between the display region and the driver; and a moisture-proof resin film covering an end of the organic protective film between the display region and the driver and not covering at least part of a top surface of the driver.

(19) In an embodiment of the present invention, the display device includes the structure (18), and the moisture-proof resin film does not cover 60% or more and 100% or less of an area of an entire top surface of the driver.

(20) In an embodiment of the present invention, the display device includes the structure (18) or (19), and further includes a heat dissipation sheet attached to a portion of the top surface of the driver not covered with the moisture-proof resin film.

(21) In an embodiment of the present invention, the display device includes the structure (18), (19), or (20), and with a direction from the driver to the display region being defined as a front direction, the conductive lines include a conductive line that extends from the driver to the display region by bypassing a diagonally front region diagonally in front of the driver and overlapping the end of the organic protective film.

(22) In an embodiment of the present invention, the display device includes the structure (21), the driver is provided along the display region, and the diagonally front region extends from a position 1.5 mm away from the driver to a position 2.5 mm away from the driver in a direction orthogonal to the direction from the driver to the display region.

(23) In an embodiment of the present invention, the display device includes the structure (21) or (22), the driver is provided along the display region, and the diagonally front region extends from a position 0.5 mm away from the driver to a position 1.0 mm away from the driver in the direction from the driver to the display region.

(24) In an embodiment of the present invention, the display device includes the structure (18), (19), (20), (21), (22), or (23), and further includes an inorganic film between the conductive lines and the organic protective film, wherein the inorganic film extends to an exterior region of the end of the organic protective film.

(25) Yet another embodiment of the present invention is directed to a display device configured to display an image in a display region, including: an insulating substrate; conductive lines provided on the insulating substrate and extending from the display region to a frame region exterior to the display region; a driver provided in the frame region and connected to the conductive lines; an organic protective film overlapping the conductive lines and extending from the display region to a region between the display region and the driver; and a moisture-proof resin film covering an end of the organic protective film between the display region and the driver, wherein with a direction from the driver to the display region being defined as a front direction, the conductive lines include a conductive line that extends from the driver to the display region by bypassing a diagonally front region diagonally in front of the driver and overlapping the end of the organic protective film.

(26) In an embodiment of the present invention, the display device includes the structure (25), the driver is provided along the display region, and the diagonally front region extends from a position 1.5 mm away from the driver to a position 2.5 mm away from the driver in a direction orthogonal to the direction from the driver to the display region.

(27) In an embodiment of the present invention, the display device includes the structure (25) or (26), the driver is provided along the display region, and the diagonally front region extends from a position 0.5 mm away from the driver to a position 1.0 mm away from the driver in the direction from the driver to the display region.

(28) In an embodiment of the present invention, the display device includes the structure (25), (26), or (27), and further includes an inorganic film between the conductive lines and the organic protective film, wherein the inorganic film extends to an exterior region of the end of the organic protective film.

(29) In an embodiment of the present invention, the display device includes the structure (1), (2), (3), (4), (5), (6), (7), (8), (9), (10), (11), (12), (13), (14), (15), (16), (17), (18), (19), (20), (21), (22), (23), (24), (25), (26), (27), or (28), and the display device is a liquid crystal display device.

(30) In an embodiment of the present invention, the display device includes the structure (1), (2), (3), (4), (5), (6), (7), (8), (9), (10), (11), (12), (13), (14), (15), (16), (17), (18), (19), (20), (21), (22), (23), (24), (25), (26), (27), or (28), and the display device is an organic electroluminescent display device.

The present invention can provide a display device capable of preventing or reducing short-circuiting in an alternating high and low temperature environment.

DETAILED DESCRIPTION OF THE INVENTION

Hereinafter, embodiments of the present invention are described. The present invention is not limited to the following embodiments, and the design of the present invention can be modified as appropriate within the range satisfying the configuration of the present invention. The modes in the embodiments may appropriately be combined or modified within the gist of the present invention.

Embodiment 1

Figure 1:
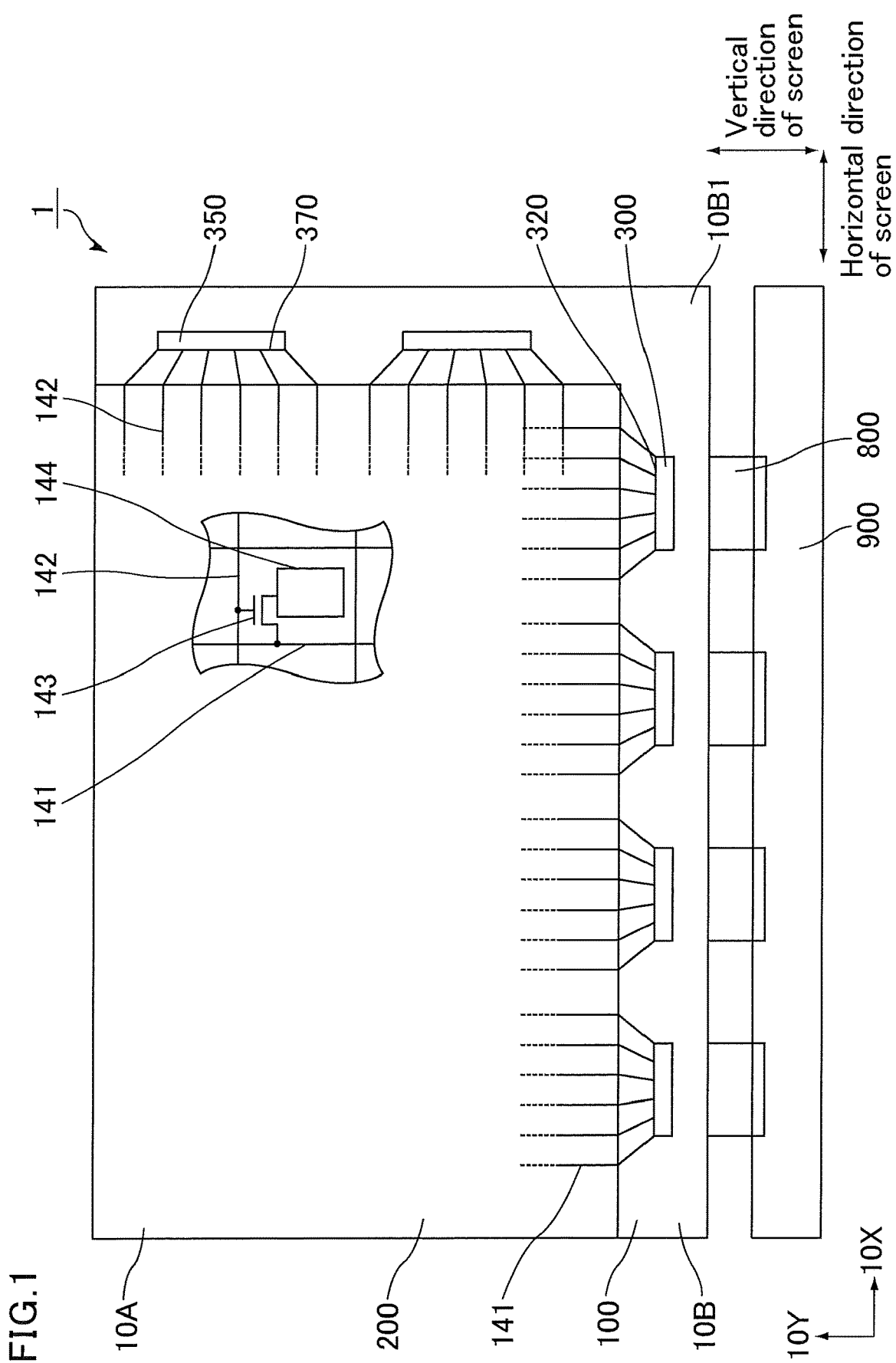
FIG. 1 is a schematic plan view of a liquid crystal display device of Embodiment 1.
Figure 2:
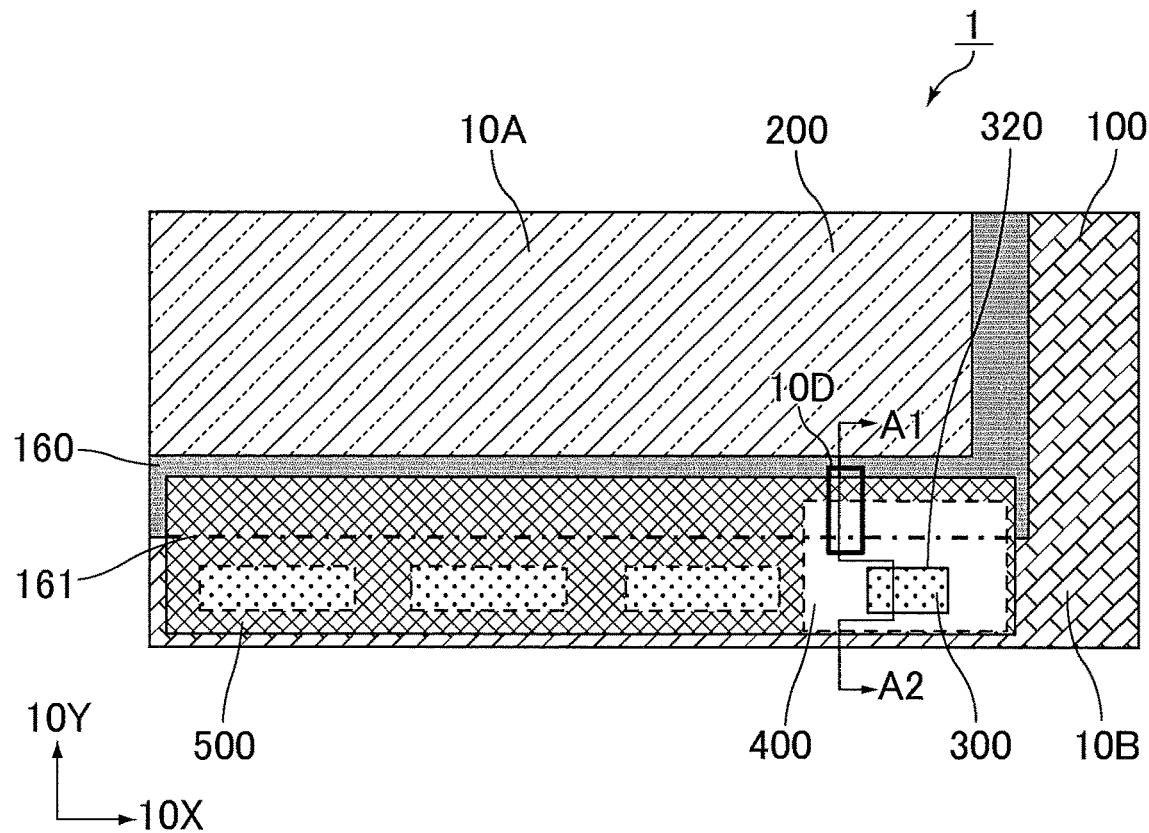
FIG. 2 is another schematic plan view of the liquid crystal display device of Embodiment 1.
Figure 3:
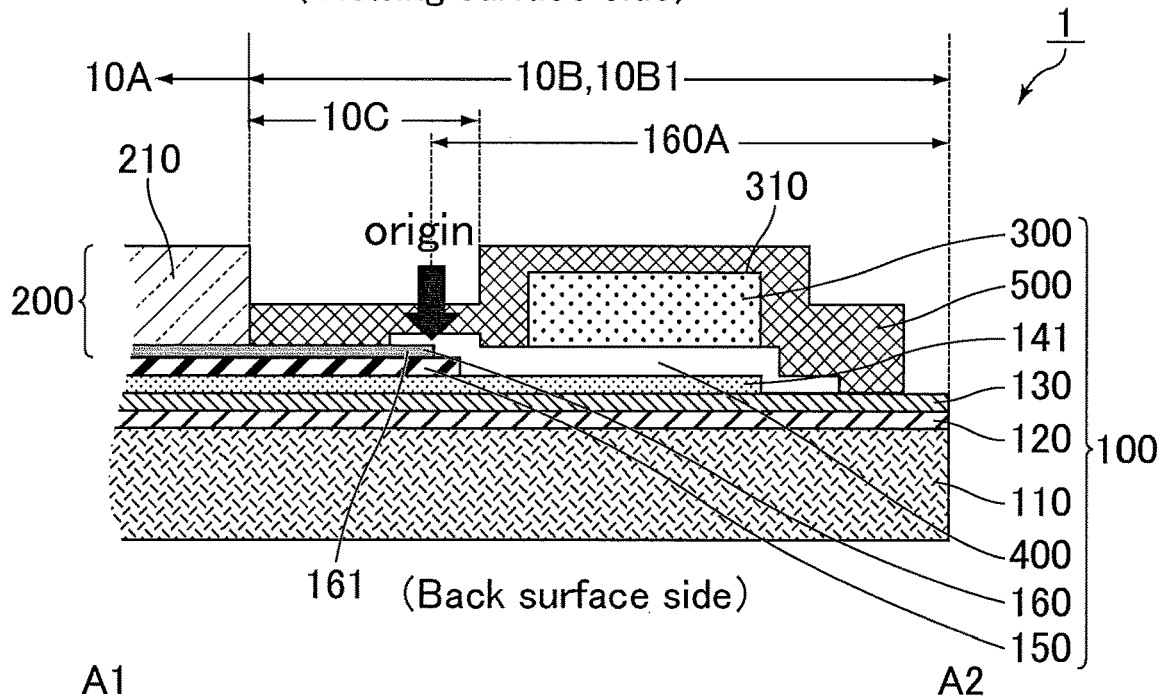
FIG. 3 is a schematic cross-sectional view of an extension region in the liquid crystal display device of Embodiment 1.

The present embodiment is described using an example in which the display device is a liquid crystal display device. The present embodiment describes a mode in which an anisotropic conductive film is provided between the end of an organic protective film and a moisture-proof resin film to avoid (Condition 1) above, preventing or reducing short-circuiting. FIG. 1 is a schematic plan view of a liquid crystal display device of Embodiment 1. FIG. 2 is another schematic plan view of the liquid crystal display device of Embodiment 1. FIG. 3 is a schematic cross-sectional view of an extension region in the liquid crystal display device of Embodiment 1. FIG. 3 is a schematic cross-sectional view taken along the line A1-A2 in FIG. 2. The portions whose outline is depicted with a dashed line in FIG. 2 are covered with another layer. Although FIG. 3 shows the details of the structure near the source driver at the right end, the other source drivers have the same structure.

As shown in FIG. 1 to FIG. 3, a liquid crystal display device 1 of the present embodiment includes a display region 10A configured to display an image and a frame region 10B surrounding the display region 10A, and also includes, in the order from the back surface to the viewing surface, a thin-film transistor (TFT) substrate 100, a liquid crystal layer, and a color filter (CF) substrate 200.

In the liquid crystal display device 1, the display region 10A is positioned closer to one end in the short-side direction (the lower end in FIG. 1) and to one end in the long-side direction (the left end in FIG. 1). The frame region 10B includes an extension region 10B1 where the TFT substrate 100 is exposed without being layered with the CF substrate 200. Various drivers are mounted in the extension region 10B1. To the extension region 10B1 is connected a printed wired board (PWB) 900 through flexible printed circuits (FPCs) 800.

The TFT substrate 100 includes an insulating substrate 110; a basecoat film 120 provided on the insulating substrate 110; gate lines 142 provided on the basecoat film 120; a gate insulator 130 provided on the gate lines 142; source lines 141 provided on the gate insulator 130 and functioning as the conductive lines described above; an inorganic film 150 provided on the source lines 141; source drivers 300 each functioning as the source driver described above, which are provided in the frame region 10B, particularly in the extension region 10B1, and connected to the source lines 141; gate drivers 350 provided in the frame region 10B, particularly in the extension region 10B1, and connected to the gate lines 142; an organic protective film 160 provided on the inorganic film 150, overlapping the source lines 141, and extending from the display region 10A to a region 10C between the display region 10A and the source drivers 300; anisotropic conductive films (ACFs) 400 provided under the respective source drivers 300 and covering the end 161 of the organic protective film 160 between the display region 10A and the respective source drivers 300; and a moisture-proof resin film 500 overlapping the anisotropic conductive films 400 between the display region 10A and the respective source drivers 300 and covering the end 161 of the organic protective film 160.

The liquid crystal display device 1 of the present embodiment includes the moisture-proof resin film 500 that has a moisture proof/waterproof property and covers the entire extension region 10B1, for better reliability against the humidity in the environment. However, when a site with a varying structure and varying physical properties (for example, a site with physical properties changing from those of the organic protective film 160 to those of the inorganic film 150, a site with a varying structure such as the end 161 of the organic protective film 160) in the base film arranged closer to the back surface than the moisture-proof resin film 500 is further covered with the moisture-proof resin film 500, stress tends to be concentrated on the site with a varying structure and varying physical properties in the base film when the moisture-proof resin film 500 becomes hard due to deterioration. This requires improvement of the structure so as to eliminate direct application of stress to the base film.

Figure 4:
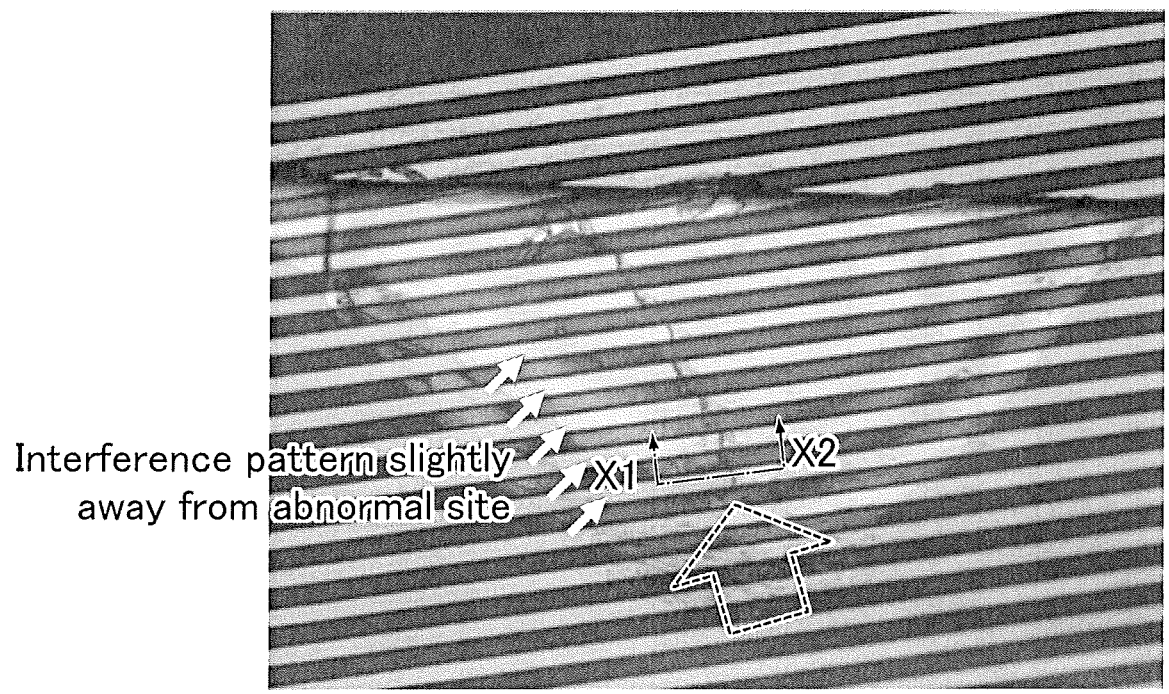
FIG. 4 is an example of a photograph showing a crack that occurs when a liquid crystal display device of a comparative embodiment is exposed to an alternating low and high temperature environment.
Figure 5:
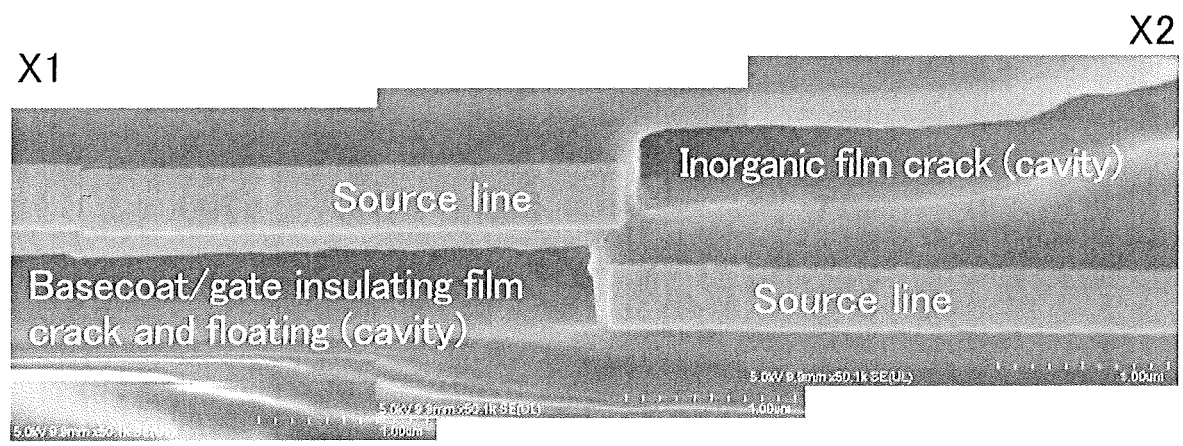
FIG. 5 is a scanning electron microscopic photograph of a cross section taken along the line X1-X2 in FIG. 4.

A crack occurring in the liquid crystal display device 1R of the comparative embodiment is described in more detail. FIG. 4 is an example of a photograph showing a crack that occurs when the liquid crystal display device of the comparative embodiment is exposed to an alternating low and high temperature environment. FIG. 5 is a scanning electron microscopic photograph of a cross section taken along the line X1-X2 in FIG. 4. The solid arrows in FIG. 4 indicate short-circuited source lines 141, and the dashed arrow indicates the observation direction under a scanning electron microscope. When the liquid crystal display device 1R of the comparative embodiment is exposed to an alternating low and high temperature environment, the inorganic film 150, which is very hard, is damaged by the crack in the moisture-proof resin film 500, which is an upper layer, so that the crack shown in FIG. 4 and FIG. 5 occurs. Presumably, when the moisture-proof resin film 500, which is an upper layer, becomes hard due to deterioration at high temperature and then exposed to low temperature, the moisture-proof resin film 500, upon cracking, applies large stress to the base film to cause a crack in the inorganic film 150. In addition, the high adhesion between the layers of the base film is considered to be a condition leading to deep crack development.

Thus, in the present embodiment, the end 161 of the organic protective film 160 between the display region 10A and the source drivers 300 is covered with the respective anisotropic conductive films 400, and the moisture-proof resin film 500 overlapping the anisotropic conductive films 400 is provided between the display region 10A and the respective source drivers 300. The force of adhesion between the anisotropic conductive films 400 and the organic protective film 160 and/or the force of adhesion between the anisotropic conductive films 400 and the moisture-proof resin film 500 are/is weaker than the force of adhesion between the organic protective film 160 and the moisture-proof resin film 500. Providing the anisotropic conductive films 400 between the end 161 of the organic protective film 160 and the moisture-proof resin film 500 therefore increases the likelihood of interlayer peeling between the end 161 of the organic protective film 160 and the moisture-proof resin film 500. This makes it possible to prevent or reduce propagation of the crack 500X in the moisture-proof resin film 500 to the organic protective film 160 and conductive lines (e.g., source lines 141) provided closer to the insulating substrate 110 than the organic protective film 160, thereby preventing or reducing short-circuiting of the source lines 141 in an alternating high and low temperature environment.

The above method, which covers the end 161 of the organic protective film 160 between the display region 10A and the source drivers 300 with the respective anisotropic conductive films 400 and provides the moisture-proof resin film 500 overlapping the anisotropic conductive films 400 between the display region 10A and the respective source drivers 300 to prevent or reduce short-circuiting of the source lines 141, is also referred to as Countermeasure 1. The present embodiment is described in detail below.

As shown in FIG. 1, the TFT substrate 100 includes, on the insulating substrate 110 in the display region 10A, parallel gate lines 142 extending in the horizontal direction of the screen and parallel source lines 141 extending in the direction intersecting the gate lines 142 through an insulating film (i.e., the vertical direction of the screen). The gate lines 142 and the source lines 141 are formed in a grid pattern that defines the pixels.

At each intersection of a source line 141 and a gate line 142 is provided a TFT 143 which behaves as a switching element. The TFT substrate 100 includes pixel electrodes 144. Each pixel electrode 144 is provided in a corresponding region surrounded by two adjacent source lines 141 and two adjacent gate lines 142, and electrically connected to a corresponding source line 141 through the semiconductor layer in a corresponding TFT 143.

The CF substrate 200 includes an insulating substrate 210, a common electrode, a CF layer, and a black matrix layer. The CF layer of the CF substrate 200 consists of red color filters, green color filters, and blue color filters. Each pixel includes three sub-pixels, namely a sub-pixel with a red color filter, a sub-pixel with a green color filter, and a sub-pixel with a blue color filter, in a stripe pattern. The desired color for each pixel can be obtained by mixing the light rays passing through the red color filter, green color filter, and blue color filter while controlling the amounts of light rays of these colors.

The black matrix layer of the CF substrate 200 is a light-shielding component provided in a grid pattern to partition each color filter in the color filter layer. The common electrode in the present embodiment is provided in the CF substrate 200, but the common electrode may be provided in the TFT substrate 100. When the common electrode is provided in the TFT substrate 100, the common electrode is provided on the viewing surface sides or back surface sides of the pixel electrodes 144 with an insulating film in between.

The liquid crystal layer contains a liquid crystal material, and applies voltage to the liquid crystal layer to change the alignment state of liquid crystal molecules in the liquid crystal material according to the voltage applied, thereby controlling the amount of light transmitted. The anisotropy of dielectric constant (As) of the liquid crystal molecules defined by the following formula (L) may be positive or negative. Liquid crystal molecules having a positive anisotropy of dielectric constant are also referred to as positive liquid crystals, while liquid crystal molecules having a negative anisotropy of dielectric constant are also referred to as negative liquid crystals. The major axis direction of the liquid crystal molecules is the slow axis direction. The liquid crystal molecules are homogeneously aligned when no voltage is applied (in the no-voltage-applied state). The major axis direction of the liquid crystal molecules in the no-voltage-applied state is also referred to as the initial alignment direction of the liquid crystal molecules.

$$\Delta\varepsilon = \text{(dielectric constant of liquid crystal molecules in major axis direction)} - \text{(dielectric constant of liquid crystal molecules in minor axis direction)} \qquad (L)$$

An alignment film having a function to control the alignment of liquid crystal molecules in the liquid crystal layer is provided between the TFT substrate 100 and the liquid crystal layer and between the CF substrate 200 and the liquid crystal layer.

The liquid crystal display device 1 of the present embodiment includes, in the frame region 10B of the TFT substrate 100, particularly in the extension region 10B1, the source drivers 300 electrically connected to the source lines 141, the gate drivers 350 electrically connected to the gate lines 142, and a controller. The gate drivers 350 each sequentially supply scanning signals to the gate lines 142 based on the control by the controller. The source drivers 300 each supply data signals to the source lines 141 based on the control by the controller when the corresponding TFTs 143 are triggered to be in the voltage applied state by the scanning signals.

Each pixel electrode 144 is set to have an electrical potential corresponding to the data signal supplied through the corresponding TFT 143, such that an electric field is generated between the pixel electrode 144 and the common electrode and thereby the alignment of liquid crystal molecules in the liquid crystal layer is controlled. The liquid crystal display device 1 changes the alignment state of liquid crystal molecules in each pixel according to the magnitude of voltage applied to the liquid crystal layer so as to adjust the transmittance of light through the liquid crystal layer, thereby displaying an image.

The insulating substrates 110 and 210 are insulating colorless, transparent substrates. The insulating substrates 110 and 210 may each be, for example, a glass substrate or a plastic substrate, for example. A glass substrate may be made of, for example, glass such as float glass or soda glass. A plastic substrate may be made of, for example, polyethylene terephthalate, polybutylene terephthalate, polyether sulfone, polycarbonate, or aliphatic polyolefin. The insulating substrate 110 in the present embodiment is a glass substrate.

The basecoat film 120 is a colorless transparent film provided on the viewing surface side of the insulating substrate 110. The gate insulator 130 is a colorless transparent film provided on the viewing surface side of the basecoat film 120. The basecoat film 120 and the gate insulator 130 may each be an inorganic insulating film, for example. The inorganic insulating film may be, for example, an insulating film containing an inorganic material such as silicon nitride ($SiN_x$), silicon oxide ($SiO_2$), or silicon nitride oxide (SiNO), or a laminate film thereof.

The gate lines 142 are provided on the insulating substrate 110, specifically on the viewing surface side of the basecoat film 120, and extend from the display region 10A to the frame region 10B exterior to the display region 10A, particularly to the extension region 10B1, in the direction parallel to the screen. The gate lines 142 are radially provided from surfaces 370, which face the display region 10A, of the gate drivers 350 provided along the display region 10A toward the display region 10A.

The source lines 141 are provided on the insulating substrate 110, specifically on the viewing surface side of the gate insulator 130, and extend from the display region 10A to the frame region 10B exterior to the display region 10A, particularly to the extension region 10B1, in the vertical direction of the screen. The source lines 141 are radially provided from surfaces 32, which face the display region 10A, of the source drivers 300 provided along the display region 10A toward the display region 10A.

The gate lines 142 and the source lines 141 may be made of any material and is preferably made of a metal. The gate lines 142 and the source lines 141 are preferably metal lines. The gate lines 142 and the source lines 141 may each consist of a single layer of a single material or may each be a stack of layers with any adjacent two layers being made of different materials. The gate lines 142 and the source lines 141 may be, for example, conductive lines containing titanium (Ti), conductive lines containing copper (Cu), or conductive lines formed by stacking such lines.

The gate lines 142 and the source lines 141 can be formed by forming a single or multiple layers of a metal such as copper, titanium, aluminum, molybdenum, or tungsten or an alloy thereof by a technique such as sputtering, and patterning the layer(s) by a technique such as photolithography.

The inorganic film 150 is a colorless transparent film provided between the source lines 141 and the organic protective film 160 and extends to an exterior region 160A of the end 161 of the organic protective film 160. In such a mode, the inorganic film 150 is arranged under the end 161 of the organic protective film 160, so that stress tends to be concentrated around the end 161 of the organic protective film 160 when both the structure and the physical properties change.

In view of this, the present embodiment includes the anisotropic conductive films 400 provided under the respective source drivers 300 and covering the end 161 of the organic protective film 160 between the display region 10A and the respective source drivers 300 and the moisture-proof resin film 500 overlapping the anisotropic conductive films 400 between the display region 10A and the respective source drivers 300 and covering the end 161 of the organic protective film 160. This structure can prevent or reduce propagation of the crack 500X in the moisture-proof resin film 500 to the organic protective film 160 and layer(s) positioned closer to the insulating substrate 110 than the organic protective film 160. Thus, even with such an inorganic film 150 provided between the source lines 141 and the organic protective film 160 and extending to the exterior region 160A of the end 161 of the organic protective film 160, the present embodiment can effectively prevent or reduce short-circuiting of the source lines 141 in an alternating high and low temperature environment.

The inorganic film 150 extends from the display region 10A to the exterior region 160A of the end 161 of the organic protective film 160 and is typically formed on the entire surface of the insulating substrate 110 except for contact holes for electrical connection.

The inorganic film 150 can be, for example, an insulating film containing an inorganic material such as silicon nitride ($SiN_x$), silicon oxide ($SiO_2$), or silicon nitride oxide (SiNO), or a laminate film thereof (for example, a laminate film of an insulating film containing silicon oxide and an insulating film containing silicon nitride).

The organic protective film 160 is a colorless transparent film provided on the inorganic film 150 and functions to flatten the surface of the TFT substrate 100. The organic protective film 160 overlaps the source lines 141 and extends from the display region 10A to a region between the display region 10A and the source drivers 300. The end 161 of the organic protective film 160 faces the surfaces 320 of the source drivers 300 that face the display region 10A. The organic protective film 160 is formed on the entire surface of the display region 10A and the periphery of the display region 10A except for contact holes for electrical connection.

The organic protective film 160 is preferably an acrylic resin film (film mainly containing an acrylic resin as the resin component).

The anisotropic conductive films 400 function to electrically and mechanically connect the respective source drivers 300 to the TFT substrate 100. The anisotropic conductive films 400 electrically and mechanically connect each source driver 300 to the corresponding source lines 141. The anisotropic conductive films 400 can exhibit conductivity in the thickness direction thereof while retaining its insulation in the in-plane direction thereof. One anisotropic conductive film 400 is provided for each source driver 300 to connect each source line 141 to the corresponding bump of the corresponding source driver 300.

The anisotropic conductive films 400 is under the respective source drivers 300 and cover the end 161 of the organic protective film 160 between the display region 10A and the respective source drivers 300. This mode tends to cause interlayer peeling between the organic protective film 160 and the moisture-proof resin film 500. This can prevent or reduce propagation of the crack 500X in the moisture-proof resin film 500 to the organic protective film 160 and conductive lines (e.g., source lines 141) closer to the insulating substrate 110 than the organic protective film 160, preventing or reducing short-circuiting of the source lines 141 in an alternating high and low temperature environment.

The anisotropic conductive films 400 extend from under the respective source drivers 300 toward the display region 10A and cover the end 161 of the organic protective film 160. The present embodiment extends the anisotropic conductive films 400 used to mount the source drivers 300 on the TFT substrate 100 toward the display region 10A to cover the end 161 of the organic protective film 160. This eliminates the need to provide an additional layer to cover the end 161, making it easier to prevent or reduce short-circuiting.

The direction from the source drivers 300 to the display region 10A (direction parallel to the vertical direction of the screen) is defined as a direction 10Y, the direction orthogonal to the direction 10Y (direction parallel to the horizontal direction of the screen) is defined as a direction 10X, and the direction 10Y is defined as the front direction. With these definitions, the anisotropic conductive films 400 preferably cover the end 161 of the organic protective film 160 in a diagonally front region 10D. The diagonally front region 10D is a region where thermal stress is concentrated. Thus, covering the end 161 of the organic protective film 160 especially in the above region with the anisotropic conductive films 400 enables effective prevention or reduction of short-circuiting.

The present embodiment increases the widths of the anisotropic conductive films 400 as this change is easy to make. The same effect as that obtained by the above change in the present embodiment can also be obtained, if possible in terms of design, by extending the organic protective film 160 to nearby the source drivers 300 to bring the end 161 of the organic protective film 160 closer to the source drivers 300, and covering the end 161 with portions of the anisotropic conductive films 400 that cover the insulating substrate 110 when the source drivers 300 are mounted on the insulating substrate 110. Also, the anisotropic conductive films 400 covering the end 161 of the organic protective film 160 may be formed independently of the anisotropic conductive films 400 provided under the respective source drivers 300.

The anisotropic conductive films 400 are each preferably an epoxy-based resin film (film mainly containing an epoxy resin as a resin component) and contain conductive fine particles in the epoxy-based resin film.

The moisture-proof resin film 500 functions to prevent or reduce entry of moisture. In the frame region 10B, the organic protective film 160, the anisotropic conductive films 400, and the source drivers 300 are covered with the moisture-proof resin film 500 on the viewing surface side, which can prevent or reduce entry of moisture to the liquid crystal display device 1. In the present embodiment, the entire top surface 310 of each source driver 300 is covered with the moisture-proof resin film 500.

The moisture-proof resin film 500 overlaps the anisotropic conductive films 400 between the display region 10A and the respective source drivers 300 and covers the end 161 of the organic protective film 160. In other words, the anisotropic conductive films 400 and the moisture-proof resin film 500 are sequentially provided on the end 161 of the organic protective film 160 from the back surface side to the viewing surface side. This mode tends to cause interlayer peeling between the end 161 of the organic protective film 160 and the moisture-proof resin film 500. This can prevent or reduce propagation of the crack 500X in the moisture-proof resin film 500 to the organic protective film 160 and conductive lines closer to the insulating substrate 110 than the organic protective film 160 (e.g., source lines 141), preventing or reducing short-circuiting of the source lines 141 in an alternating high and low temperature environment.

The moisture-proof resin film 500 can be, for example, a styrene copolymer-based resin film (film mainly containing a styrene copolymer as the resin component), an epoxy-based resin film (film mainly containing an epoxy resin as the resin component), and a urethane acrylate-based resin film (film mainly containing urethane acrylate as the resin component). The styrene copolymer resin film can be, for example, a styrene-butadiene-based resin film (film mainly containing styrene butadiene as the resin component). The moisture-proof resin film 500 is preferably a styrene-butadiene-based resin film. The moisture-proof resin film 500 can be, for example, "TUFFY" (trade name) available from Hitachi Chemical Co., Ltd.

When the moisture-proof resin film 500 is a styrene-butadiene-based resin film, for example, the Young's modulus is 100 MPa or more and 120 MPa or less in the initial stage (immediately after the film formation) at $-40°$ C., 50 MPa or more and 60 MPa or less after standing at $100°$ C. for 500 hours, and 2000 MPa or more and 3000 MPa or less after standing at $100°$ C. for 1000 hours. Also, the moisture-proof resin film 500 has a Young's modulus of 10 MPa or more and 20 MPa or less in the initial stage at $20°$ C., 10 MPa or more and 20 MPa or less after standing at $100°$ C. for 500 hours, and 2000 MPa or more and 3000 MPa or less after standing at $100°$ C. for 1000 hours. The moisture-proof resin film 500 has a Young's modulus of 1 MPa or more and 10 MPa or less in the initial stage at $80°$ C., 1 MPa or more and 10 MPa or less after standing at $100°$ C. for 500 hours, and 1500 MPa or more and 2500 MPa or less after standing at $100°$ C. for 1000 hours.

The moisture-proof resin film 500 in the initial stage (immediately after the film formation), for example, has a coefficient of linear expansion of 150 ppm/$°$ C. or more and 200 ppm/$°$ C. or less at $-40°$ C., 200 ppm/$°$ C. or more and 300 ppm/$°$ C. or less at $20°$ C., and 8500 ppm/$°$ C. or more and 9500 ppm/$°$ C. or less at $80°$ C.

When the organic protective film 160 is an acrylic resin film and the moisture-proof resin film 500 is a styrene butadiene-based resin film, the force of adhesion between the organic protective film 160 and the moisture-proof resin film 500 is strong, and thus the crack 500X in the moisture-proof resin film 500 is more likely to propagate to the base layer including the organic protective film 160. Here, the force of adhesion between the epoxy-based resin film and the acrylic resin film and/or the force of adhesion between the epoxy-based resin film and the styrene butadiene-based resin film are weaker than the force of adhesion between the acrylic resin film and the styrene butadiene-based resin film. In the present embodiment, use of epoxy-based resin films as the anisotropic conductive films 400 enables effective prevention or reduction of propagation of the crack 500X in the moisture-proof resin film 500 to the base layer, thereby effectively preventing or reducing shot-circuiting of the source lines 141 in an alternating high and low temperature environment.

Modified Example 1 of Embodiment 1

Figure 6A:
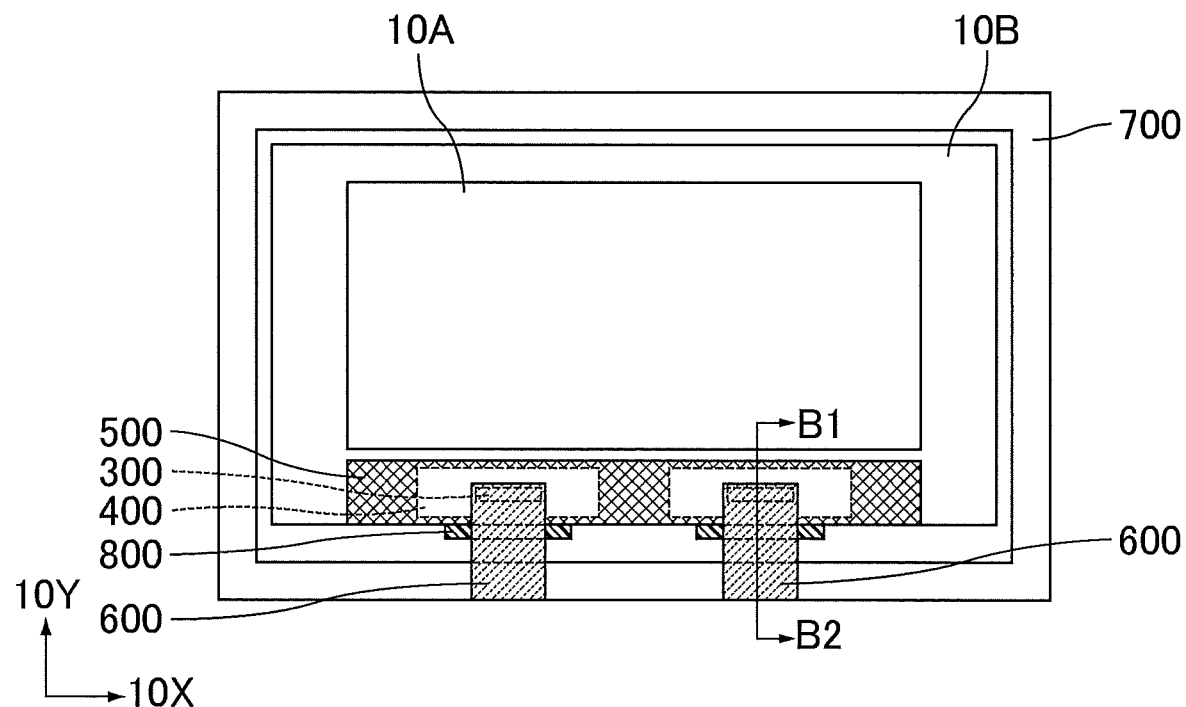
FIG. 6A is a schematic plan view of a liquid crystal display device of Modified Example 1 of Embodiment 1.

FIG. 6A is a schematic plan view of a liquid crystal display device of Modified Example 1 of Embodiment 1.

Figure 6B:
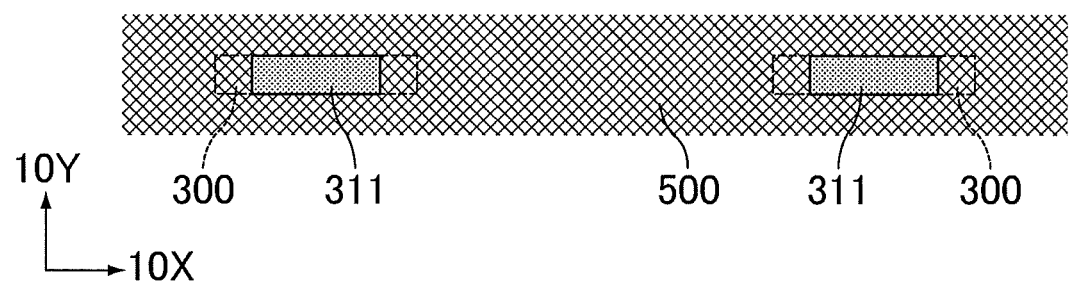
FIG. 6B is a schematic plan view showing the arrangement of a moisture-proof resin film and source drivers in the liquid crystal display device of Modified Example 1 of Embodiment 1.
Figure 6C:
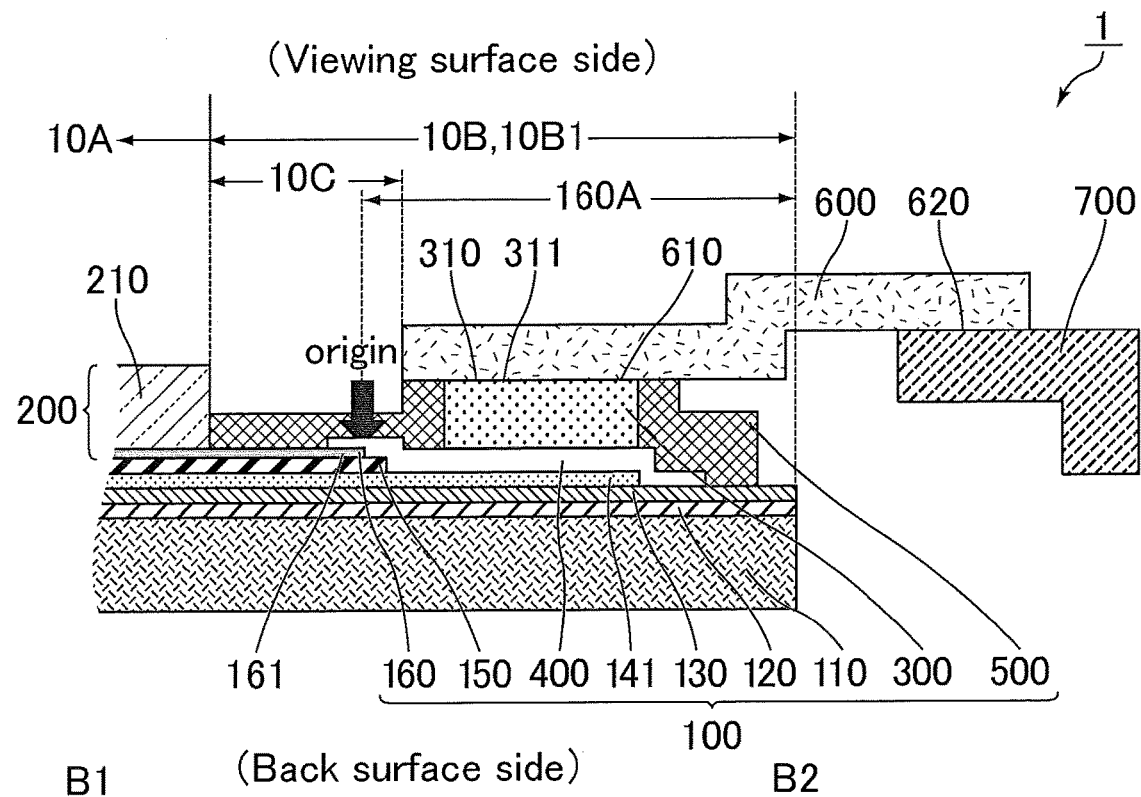
FIG. 6C is a schematic cross-sectional view of the liquid crystal display device of Modified Example 1 of Embodiment 1.

FIG. 6B is a schematic plan view showing the arrangement of a moisture-proof resin film and source drivers in the liquid crystal display device of Modified Example 1 of Embodiment 1. FIG. 6C is a schematic cross-sectional view of the liquid crystal display device of Modified Example 1 of Embodiment 1. FIG. 6C is a schematic cross-sectional view taken along the line B1-B2 in FIG. 6A. While the entire top surface 310 of each source driver 300 is covered with the moisture-proof resin film 500 in the embodiment above, the moisture-proof resin film 500 in the liquid crystal display device 1 of the modified example does not cover at least part of the top surface 310 of each source driver 300 as shown in FIGS. 6A to 6C. More specifically, as shown in FIG. 6B, the top surface 310 of each source driver 300 has a portion 311 not covered with the moisture-proof resin film 500.

A liquid crystal display device causes a crack when a moisture-proof resin film is hardened due to oxidative deterioration by heat from source drivers. In contrast, not covering at least part of the top surface 310 of each source driver 300 with the moisture-proof resin film 500 as in the present modified example enables prevention or reduction of transfer of heat generated by the source drivers 300 to the moisture-proof resin film 500 (for example, the increase in temperature of the moisture-proof resin film 500 can be reduced by about 5 degrees), thereby preventing or reducing occurrence of the crack 500X in the moisture-proof resin film 500. This can further prevent or reduce short-circuiting of the source lines 141 in an alternating high and low temperature environment. From the same point of view, preferably, the moisture-proof resin film 500 does not cover the entire top surface 310 of each source driver 300. The top surface 310 of each source driver 300 refers to the surface of the source driver 300 remote from the insulating substrate 110.

The above method, which does not cover at least part of the top surface 310 of each source driver 300 with the moisture-proof resin film 500 to prevent or reduce short-circuiting of the source lines 141, is also referred to as Countermeasure 2.

Not covering at least part of the top surface 310 of each source driver 300 with the moisture-proof resin film 500 means that the moisture-proof resin film 500 does not cover 60% or more of the area of the entire top surface 310 of each source driver 300. In other words, the area of the portion 311 not covered with the moisture-proof resin film 500 is 60% or more of the area of the entire top surface 310 of the source driver 300. The moisture-proof resin film 500 preferably does not cover 60% or more and 100% or less, more preferably 100%, of the area of the entire top surface 310 of each source driver 300.

Preferably, the portion 311 not covered with the moisture-proof resin film 500 includes a central portion of the top surface 310 of the source driver 300 in the direction 10X and is a region occupying 60% or more of the area of the entire top surface 310 of the source driver 300. This mode can more effectively prevent or reduce short-circuiting of the source lines 141.

As shown in FIGS. 6A to 6C, the liquid crystal display device 1 of the present modified example further includes a heat dissipation sheet 600 attached to the portion 311 not covered with the moisture-proof resin film 500 of the top surface 310 of the corresponding source driver 300. This mode can release heat generated by the source drivers 300 through the heat dissipation sheets 600 (for example, the increase in temperature of the moisture-proof resin film 500 can be reduced by about 5 degrees), further preventing or reducing occurrence of the crack 500X in the moisture-proof resin film 500. This mode can therefore further prevent or reduce short-circuiting of the source lines 141 in an alternating high and low temperature environment.

When the heat dissipation sheets 600 are provided to increase the efficiency of heat dissipation, the source drivers 300 and the respective heat dissipation sheets 600 are preferably in direct contact with each other for stable heat dissipation. When the direct contact portion between each source driver 300 and the corresponding heat dissipation sheet 600 includes the central portion of the top surface 310 of the source driver 300 and occupies 60% or more of the area of the entire top surface 310 of the source driver 300, the display device is presumed to demonstrate a performance almost the same as a display device in which the entire top surface 310 of each source driver 300 is in direct contact with the corresponding heat dissipation sheet 600 (for example, the increase in temperature of the moisture-proof resin film 500 is reduced by about 5 degrees).

The heat dissipation sheet 600 is a heat dissipation component and is a heat conductive sheet made of an insulating resin material with a high thermal conductivity. The heat dissipation sheet 600 can be, for example, a laminate heat dissipation sheet of graphite and resin, which is called a graphite sheet. The heat dissipation sheet 600 has a thermal conductivity of, for example, 600 W/m·K or more and 2000 W/m·K or less.

A first end 610 of each heat dissipation sheet 600 is in contact with the top surface 310 of the corresponding source driver 300, while a second end 620 of the heat dissipation sheet 600 is in contact with a metal chassis 700 housing the liquid crystal display device 1. The source drivers 300 are thermally and mechanically connected to the metal chassis 700 through the respective heat dissipation sheets 600. Heat generated by the source drivers 300 is conducted to the metal chassis 700 through the respective heat dissipation sheets 600 for dissipation.

Modified Example 2 of Embodiment 1

Figure 7:
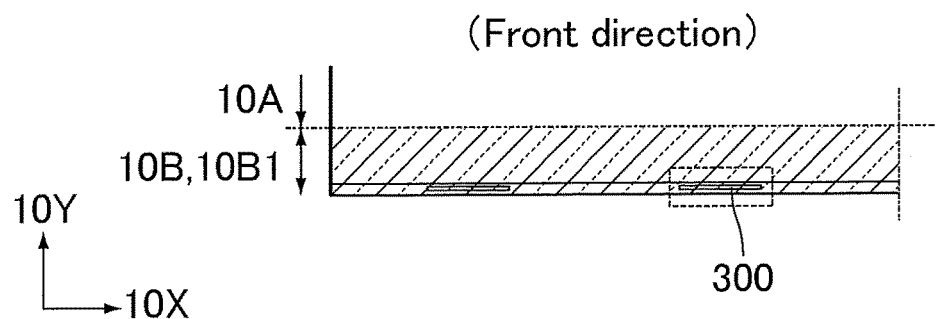
FIG. 7 is a schematic plan view of a frame region in a liquid crystal display device of Modified Example 2 of Embodiment 1.
Figure 8:
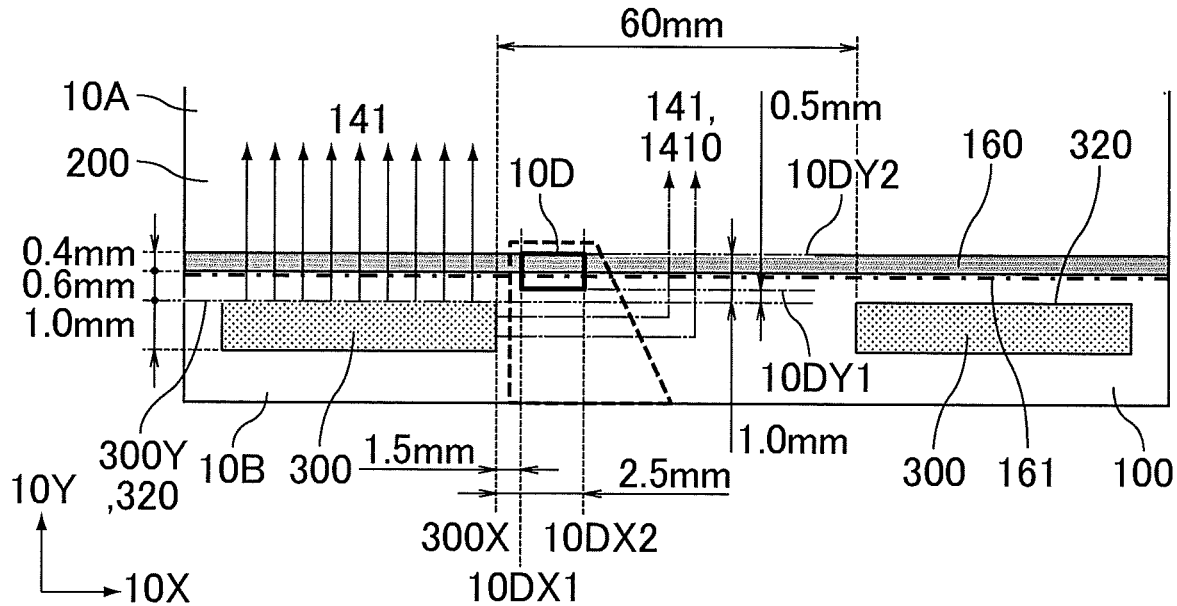
FIG. 8 is an enlarged schematic plan view of the frame region in the liquid crystal display device of Modified Example 2 of Embodiment 1.

FIG. 7 is a schematic plan view of a frame region in a liquid crystal display device of Modified Example 2 of Embodiment 1. FIG. 8 is an enlarged schematic plan view of the frame region in the liquid crystal display device of Modified Example 2 of Embodiment 1. FIG. 8 is an enlarged view of the region surrounded by the dotted line in FIG. 7. In the embodiment above, the source lines 141 radially extend from the source drivers 300 to the display region 10A. In the liquid crystal display device 1 of the present modified example, as shown in FIG. 7 and FIG. 8, with the direction 10Y from the source drivers 300 to the display region 10A (the direction parallel to the vertical direction of the screen) defined as the front direction, the source lines 141 include the source lines 141 (bypass source lines 1410) that extend from the corresponding source driver 300 to the display region 10A by bypassing the diagonally front region 10D diagonally in front of the source driver 300 and overlapping the end 161 of the organic protective film 160.

The diagonally front region 10D is a region where thermal stress is concentrated when the moisture-proof resin film 500 hardened by heat is exposed to low temperature. With the source lines 141 (bypass source lines 1410) bypassing the diagonally front region 10D can further prevent or reduce short-circuiting of the source lines 141 in an alternating high and low temperature environment. Thus, preferably, the source lines 141 are arranged locally with a large interval near the diagonally front region 10D to avoid the diagonally front region 10D.

The above method, which utilizes a structure in which the source lines 141 include the source lines 141 (bypass source lines 1410) that extend from the corresponding source driver 300 to the display region 10A by bypassing the diagonally front region 10D to prevent or reduce short-circuiting of the source lines 141, is also referred to as Countermeasure 3.

The level of thermal stress generated when the moisture-proof resin film 500 hardened is exposed to low temperature depends on the location as shown in FIG. 7 and FIG. 8. The portion surrounded by the dashed line in FIG. 8 is a region where stress is concentrated and the portion indicated by the dashed dotted line is a boundary which can be the origin of a crack. The diagonally front region 10D surrounded by a solid-line quadrangle is the region in which the source lines 141 should not be formed. The dash dot arrows show the paths of the source lines 141 bypassing this region.

The portion where thermal stress is concentrated, as shown in FIG. 7 and FIG. 8, is not the region directly from the source drivers 300 to the display region 10A but is the diagonally front region 10D that is slightly away in the diagonally front direction. Thus, the present embodiment utilizes the source lines 141 avoiding the diagonally front region 10D, thereby avoiding short-circuiting due to a crack generated by concentrated thermal stress.

The portion where such a crack occurs is defined as follows according to the conditions causing a crack in the moisture-proof resin film 500.

(1) The portion included in the region where the moisture-proof resin film 500 is provided.

(2) The area where thermal stress is concentrated when the moisture-proof resin film 500 hardened is exposed to low temperature.

(3) The boundary between the organic protective film 160 and the inorganic film 150 in the TFT substrate.

The source lines 141, when formed in the area satisfying the conditions (1) to (3), may be directly affected by a crack in the moisture-proof resin film 500 thereabove and may thereby be short-circuited. Thus, a countermeasure can be taken by forming conductive lines avoiding such a portion satisfying the conditions (1) to (3), eliminating the poor reliability that can cause display defects. Such a portion satisfying the conditions (1) to (3) is designed as a diagonally front region 10D, so that crack occurrence can be effectively prevented or reduced.

Figure 9:
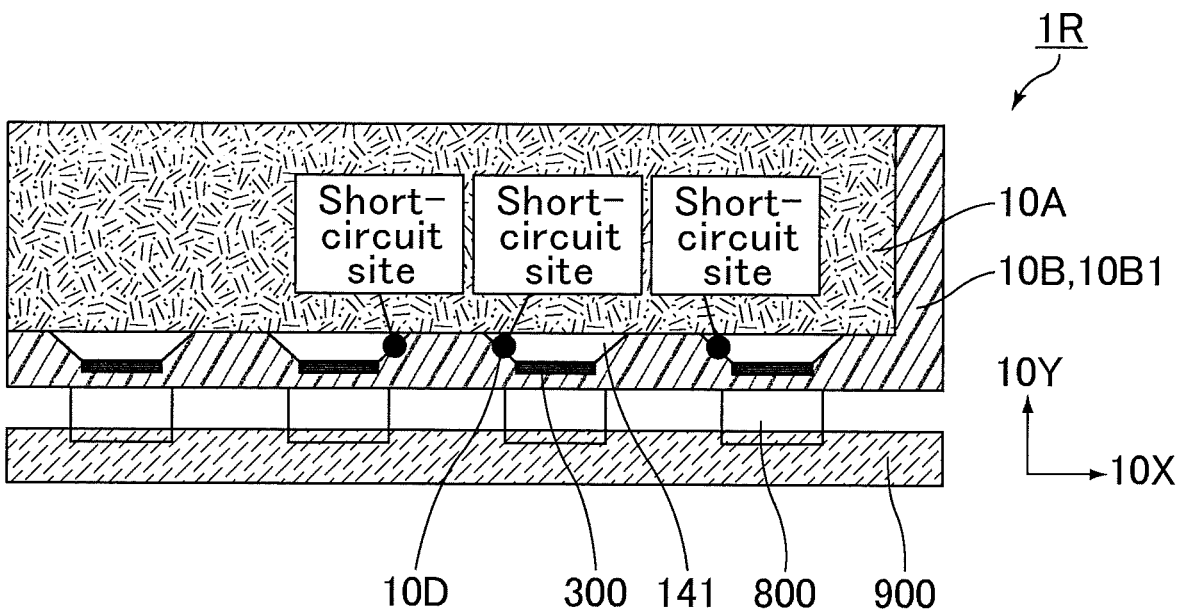
FIG. 9 is a map of short-circuit sites generated in a thermal cycling test using the liquid crystal display device of the comparative embodiment, with the results of three liquid crystal display devices shown in a schematic plan view of one liquid crystal display device.

FIG. 9 is a map of short-circuit sites generated in a thermal cycling test using the liquid crystal display device of the comparative embodiment, with the results of three liquid crystal display devices shown in a schematic plan view of one liquid crystal display device. The frame region 10B in the liquid crystal display device 1R of the comparative embodiment is connected to, as shown in FIG. 9, the printed wired board (PWB) 900 through the flexible printed circuits (FPCs) 800.

The portions (specifically, three positions) where a short circuit occurred in a thermal cycling test using the liquid crystal display device of the comparative embodiment are mapped as shown in FIG. 9. The map shows that short-circuit positions are concentrated in the diagonally front regions 10D through which the source lines 141 extend from the respective source drivers 300 than in the source drivers 300 whose temperature increases.

A short circuit occurs when the crack 500X occurred in the moisture-proof resin film 500 due to deterioration applies a high level of stress to the base film. The portions where the hardening of the moisture-proof resin film 500 simply progresses are the same as the regions where the temperature increases; the resin significantly deteriorates and becomes hard in the vicinities of the source drivers 300. However, the base conductive lines (in the present modified example, the source lines 141) are damaged at positions a little away from the above regions. This difference is caused by the thermal cycling test; specifically, the deterioration of the moisture-proof resin film 500 progresses at high temperature and a crack itself occurs due to contraction at low temperature. The portions where stress is concentrated in a stress simulation with the physical properties of the constituent materials at low temperature were the same as the portions where a short circuit occurred.

Thus, the influence of a crack caused by hardening and deterioration of the moisture-proof resin film 500 on the source lines 141 can be avoided by, with the direction from the source drivers 300 to the display region 10A defined as the front direction, forming the source lines 141 away from the certain small regions, i.e., the diagonally front regions 10D diagonally in front of the respective source drivers 300 and overlapping the end 161 of the organic protective film 160.

As shown in FIG. 8, the diagonally front regions 10D each extend in the direction 10X from the position 1.5 mm away from the corresponding source driver 300 to a position 2.5 mm away from the source driver. In other words, in the direction 10X, an end 300X of the source driver 300 closer to the diagonally front region 10D and an end 10DX1 of the diagonally front region 10D closer to the source driver 300 are 1.5 mm away from each other, and the end 300X of the source driver 300 closer to the diagonally front region 10D and an end 10DX2 of the diagonally front region 10D remote from the source driver 300 are 2.5 mm away from each other. This mode enables provision of the source lines 141 by avoiding the portions with stress concentrated, thereby further preventing or reducing short-circuiting of the source lines 141 in an alternating high and low temperature environment. The direction 10Y is the direction from the surfaces 320 of the source drivers 300 facing the display region 10A to the display region 10A.

As shown in FIG. 8, the diagonally front regions 10D each extend in the direction 10Y from the position 0.5 mm away from the corresponding source driver 300 to the position 1.0 mm away from the source driver. In other words, in the direction 10Y, an end 300Y of the source driver 300 closer to the diagonally front region 10D and an end 10DY1 of the diagonally front region 10D closer to the source driver 300 are 0.5 mm away from each other, and the end 300Y of the source driver 300 closer to the diagonally front region 10D and an end 10DY2 of the diagonally front region 10D remote from the source driver 300 are 1.0 mm away from each other. This mode enables provision of the source lines 141 by avoiding the portions with stress concentrated, thereby further preventing or reducing short-circuiting of the source lines 141 in an alternating high and low temperature environment.

Modified Example 3 of Embodiment 1

As described in the embodiment above, with the organic protective film 160, the anisotropic conductive films 400 covering the end 161 of the organic protective film 160, and the moisture-proof resin film 500 overlapping the anisotropic conductive films 400 and covering the end 161 of the organic protective film 160, propagation of the crack 500X in the moisture-proof resin film 500 to the base layer can be prevented or reduced, so that short-circuiting of the source lines 141 can be prevented or reduced. In particular, it is suitable to use an acrylic resin film as the organic protective film 160, epoxy-based resin films as the anisotropic conductive films 400, and a styrene-butadiene-based resin film as the moisture-proof resin film 500.

As described above, the same effect as in Embodiment 1 can be achieved also when a film equivalent to an acrylic resin film is provided in the portion for the organic protective film 160, a film equivalent to an epoxy-based resin film is provided in each portion for the anisotropic conductive film 400, and a film equivalent to a styrene-butadiene-based resin film is provided in the portion for the moisture-proof resin film 500. In other words, short-circuiting of the source lines 141 can be prevented or reduced by using an acrylic resin film (corresponding to the organic protective film 160 in FIG. 1, for example) overlapping the source lines 141 and extending from the display region 10A to a region 10C between the display region 10A and the source drivers 300, epoxy-based resin films (corresponding to the anisotropic conductive films 400 in FIG. 1, for example) covering the end (corresponding to the end 161 in FIG. 1, for example) of the acrylic resin film between the display region 10A and the respective source drivers 300, and a styrene-butadiene-based resin film (corresponding to the moisture-proof resin film 500 in FIG. 1, for example) overlapping the epoxy-based resin film between the display region 10A and the source drivers 300 and covering the end of the acrylic resin film.

The above method, which covers the end of the acrylic resin film with the epoxy-based resin films between the display region 10A and the respective source drivers 300 and overlaps the styrene-butadiene-based resin film with the epoxy-based resin films between the display region 10A and the respective source drivers 300 to prevent or reduce short-circuiting of the source lines 141, is also referred to as Countermeasure 4.

Countermeasures 1 to 4 each alone can prevent or reduce short-circuiting of the source lines 141. Also, two or more countermeasures can be appropriately combined, and such a combination use can more effectively prevent or reduce short-circuiting of the source lines 141.

Embodiment 2

While the case where the display device is a liquid crystal display device is described in the embodiment above, the case where the display device is an organic electroluminescent (EL) display device is described in the present embodiment.

Figure 10:
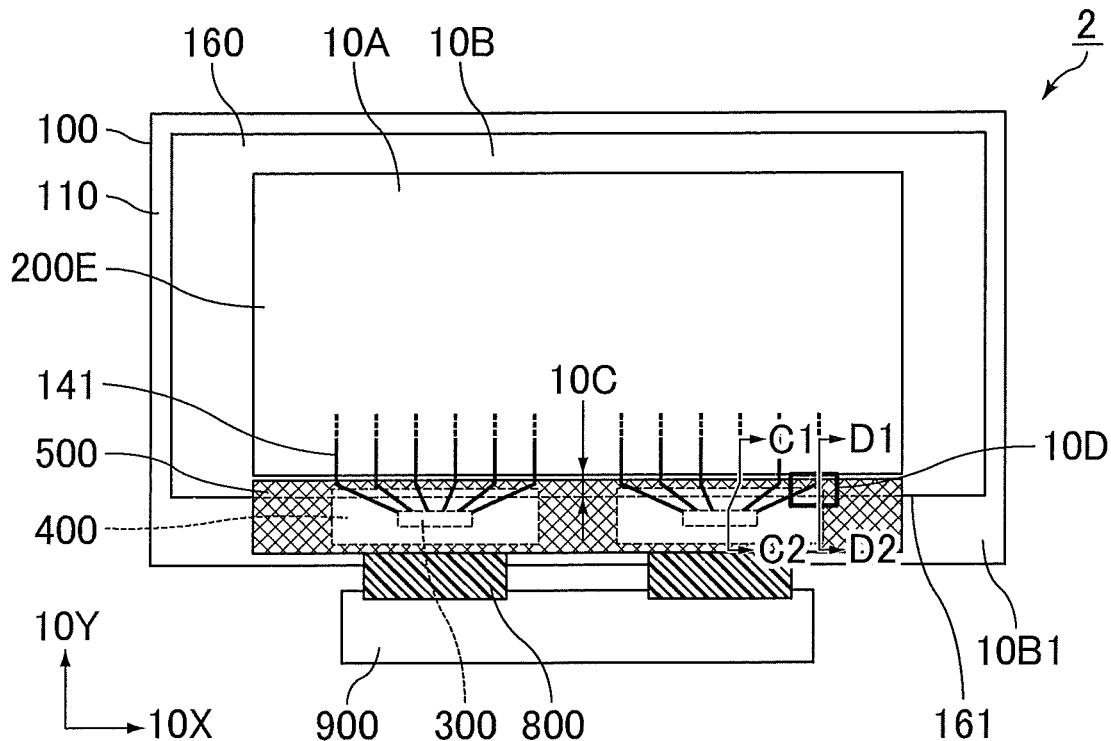
FIG. 10 is a schematic plan view of an organic EL display device of Embodiment 2.
Figure 11:
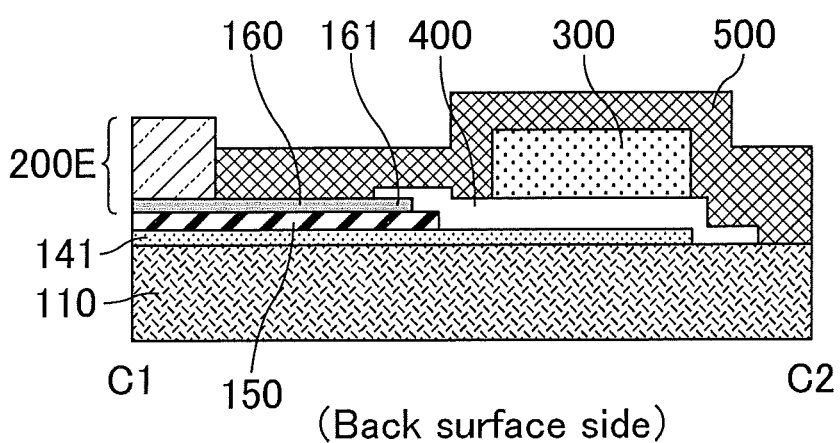
FIG. 11 is a schematic cross-sectional view of an extension region in the organic EL display device of Embodiment 2.
Figure 12:
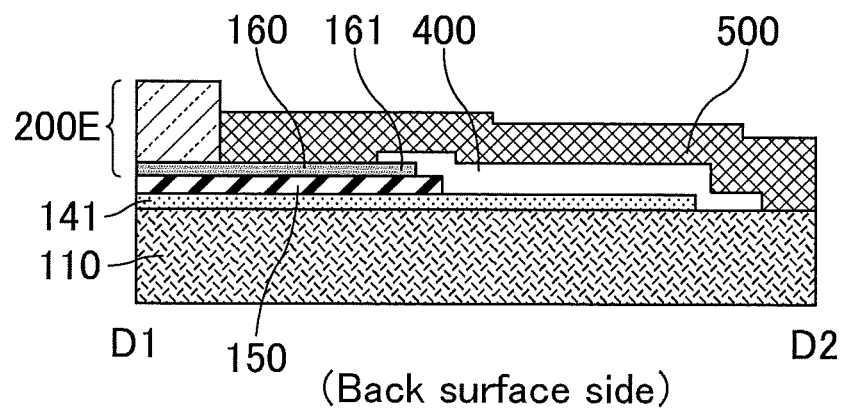
FIG. 12 is a schematic cross-sectional view of the extension region in the organic EL display device of Embodiment 2.

FIG. 10 is a schematic plan view of an organic EL display device of Embodiment 2. FIG. 11 and FIG. 12 are each a schematic cross-sectional view of an extension region in the organic EL display device of Embodiment 2. FIG. 11 is a schematic cross-sectional view taken along the line C1-C2 in FIG. 10. FIG. 12 is a schematic cross-sectional view taken along the line D1-D2 in FIG. 10, showing a region that is 1.5 mm to 2.5 mm away from the source driver 300 in the direction 10X. FIG. 12 is a schematic cross-sectional view in the diagonally front region 10D. Although the organic EL display device may employ lines such as current supply lines which may generate heat, description of such lines is omitted in the present embodiment. Also, as in Embodiment 1, an inorganic film is present between the organic protective film 160 and the source lines 141. Description of such a film is omitted in the present embodiment.

An organic EL display device 2 of the present embodiment shown in FIG. 10 to FIG. 12 includes a TFT substrate 100 with TFTs, organic elements provided on the TFT substrate 100 and connected to the respective TFTs, an adhesive layer provided in a frame shape to surround the organic EL elements, and a sealing substrate 200E provided to cover the organic EL elements. The adhesive layer bonds the periphery of the TFT substrate 100 and the periphery of the sealing substrate 200E to each other. The sealing substrate 200E may be, for example, an insulating substrate, such as a glass substrate or a plastic substrate, whose thickness is 0.4 to 1.1 mm.

When the sealing substrate 200E and the TFT substrate 100 on which the organic EL elements are stacked are bonded to each other with an adhesive layer, the organic EL elements are sealed between the substrates 100 and 200E paired with each other. This prevents entry of oxygen and moisture from the outside to the organic EL elements.

The organic EL elements can have any of the following layer structures, for example.

(1) First electrode/light-emitting layer/second electrode (2) First electrode/hole transport layer/light-emitting layer/electron transport layer/second electrode (3) First electrode/hole transport layer/light-emitting layer/hole-blocking layer/electron transport layer/second electrode (4) First electrode/hole transport layer/light-emitting layer/hole-blocking layer/electron transport layer/electron injection layer/second electrode (5) First electrode/hole injection layer/hole transport layer/light-emitting layer/electron transport layer/electron injection layer/second electrode (6) First electrode/hole injection layer/hole transport layer/light-emitting layer/hole-blocking layer/electron transport layer/second electrode (7) First electrode/hole injection layer/hole transport layer/light-emitting layer/hole-blocking layer/electron transport layer/electron injection layer/second electrode (8) First electrode/hole injection layer/hole transport layer/electron-blocking layer (carrier blocking layer)/light-emitting layer/hole-blocking layer/electron transport layer/electron injection layer/second electrode A hole injection layer and a hole transport layer may be integrated with each other. Also, an electron transport layer and an electron injection layer may be integrated with each other.

The organic EL elements may have any layer structure other than the layer structures (1) to (8), and can employ a desired layer structure suited for the desired features of the organic EL elements.

The organic EL display device 2 is an active matrix display device providing RGB full-color display, and includes a red (R), green (G), or blue (B) subpixel (dot) in each region partitioned by the source lines and the gate lines. The subpixels are arranged in a matrix pattern. In a subpixel of each color are formed an organic EL element and a light-emitting region for providing the color.

The organic EL display device 2 includes the display region 10A for displaying an image and the frame region 10B surrounding the display region 10A. The frame region 10B includes the extension region 10B1 where the TFT substrate 100 is exposed without being layered with the sealing substrate 200E. Various drivers are mounted in the extension region 10B1. To the extension region 10B1 is connected the printed wired board (PWB) 900 through the flexible printed circuits (FPCs) 800.

The TFT substrate 100 includes the insulating substrate 110; the basecoat film provided on the insulating substrate 110; gate lines provided on the basecoat film; a gate insulator provided on the gate lines; the source lines 141 provided on the gate insulator and functioning as conductive lines; an inorganic film provided on the source lines 141; the source drivers 300 provided in the frame region 10B, particularly in the extension region 10B1, and connected to the source lines 141; gate drivers provided in the frame region 10B, particularly in the extension region 10B1, and connected to the gate lines; the organic protective film 160 provided on the inorganic film, overlapping the source lines 141, and extending from the display region 10A to the region 100 between the display region 10A and the source drivers 300; the anisotropic conductive films 400 provided under the respective source drivers 300 and covering the end 161 of the organic protective film 160 between the display region 10A and the respective source drivers 300; and the moisture-proof resin film 500 overlapping the anisotropic conductive films 400 between the display region 10A and the respective source driver 300 and covering the end 161 of the organic protective film 160.

In the present embodiment, as shown in FIG. 10 to FIG. 12, the end 161 of the organic protective film 160 between the display region 10A and the source drivers 300 is covered with the respective anisotropic conductive films 400, and the moisture-proof resin film 500 overlapping the anisotropic conductive films 400 is provided between the display region 10A and the respective source drivers 300. The force of adhesion between the anisotropic conductive films 400 and the organic protective film 160 and/or the force of adhesion between the anisotropic conductive films 400 and the moisture-proof resin film 500 are/is weaker than the force of adhesion between the organic protective film 160 and the moisture-proof resin film 500. Providing the anisotropic conductive films 400 between the end 161 of the organic protective film 160 and the moisture-proof resin film 500 increases the likelihood of interlayer peeling between the end 161 of the organic protective film 160 and the moisture-proof resin film 500. This makes it possible to prevent or reduce propagation of the crack 500X in the moisture-proof resin film 500 to the organic protective film 160 and conductive lines (e.g., source lines 141) provided closer to the insulating substrate 110 than the organic protective film 160, thereby preventing or reducing short-circuiting of the source lines 141 in an alternating high and low temperature environment.

Countermeasures 1 to 4 each alone can prevent or reduce short-circuiting of the source lines 141 also in the organic EL display device. Also, two or more countermeasures can be appropriately combined, and such a combination use can more effectively prevent or reduce short-circuiting of the source lines 141.

The present invention is described in more detail based on the following examples. These examples, however, are not intended to limit the scope of the present invention.

Example 1

Figure 13:
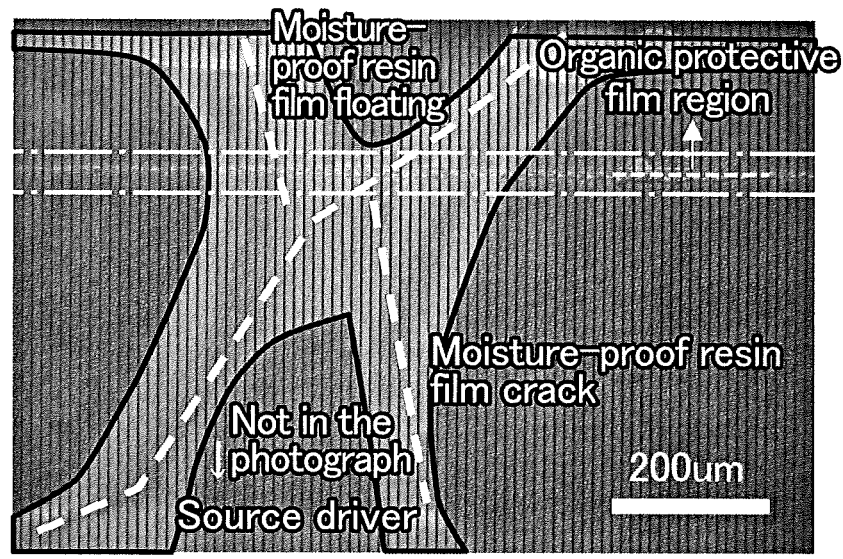
FIG. 13 is a photograph showing cracks occurred in a thermal cycling test in a liquid crystal display device of Example 1.

FIG. 13 is a photograph showing cracks occurred in a thermal cycling test in a liquid crystal display device of Example 1. The liquid crystal display device of Example 1 is the liquid crystal display device of Embodiment 1 utilizing an acrylic resin film as the organic protective film 160, epoxy-based resin films as the anisotropic conductive films 400, and a styrene-butadiene-based resin film as the moisture-proof resin film 500.

The liquid crystal display device of Example 1 was subjected to a thermal cycling test modified by setting the high temperature in a thermal cycling test, which repeats driving at 85° C. for 75 minutes and storage at −40° C. for 75 minutes for 522 cycles (1849 hours), to 110° C. Crack occurrence in the liquid crystal display device of Example 1 was observed. The temperature was changed by 4° C./min.

Under this condition, the moisture-proof resin film in the liquid crystal display device of Example 1 was hardened after about 350 hours, causing peeling and floating of the moisture-proof resin film from the anisotropic conductive film in the region surrounded by the black thick lines in FIG. 13. This resulted in the crack indicated by the thick white dashed lines in FIG. 13. The dotted line in the region surrounded by the dashed dotted lines in FIG. 13 indicates the end of the organic protective film, and the region surrounded by the dashed dotted lines is a portion where the anisotropic conductive film is arranged over the step formed by the base. The anisotropic conductive film in the region surrounded by the dashed dotted lines may not be able to completely cover the base, and the floated portion of the anisotropic conductive film appears faintly as a white line in the region surrounded by the dashed dotted lines.

The liquid crystal display device of the comparative embodiment without the anisotropic conductive films 400 causes several deep cracks causing a short circuit. In contrast, since the moisture-proof resin film in Example 1 peels from the anisotropic conductive film, the crack in the moisture-proof resin film did not affect the thin films and conductive lines in the TFT substrate (for example, the inorganic film, source lines), which are under the anisotropic conductive film. These results show that providing an anisotropic conductive film with an increased width between the end of the organic protective film and the moisture-proof resin film is very effective.

Example 2

Figure 14:
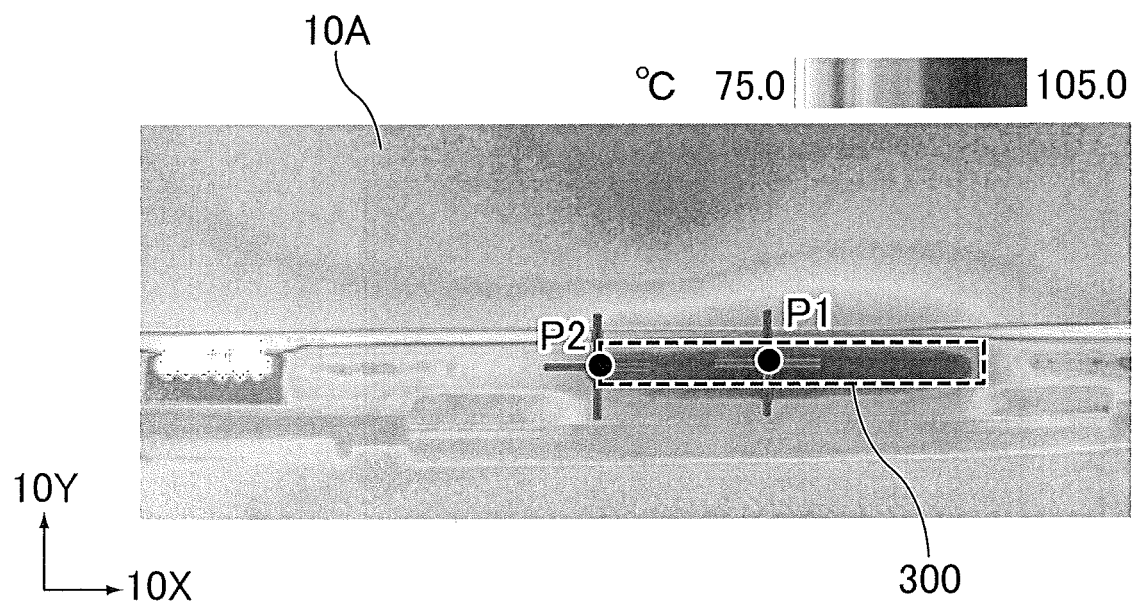
FIG. 14 is a view showing a temperature distribution in a source driver of a liquid crystal display device of Example 2.
Figure 15:
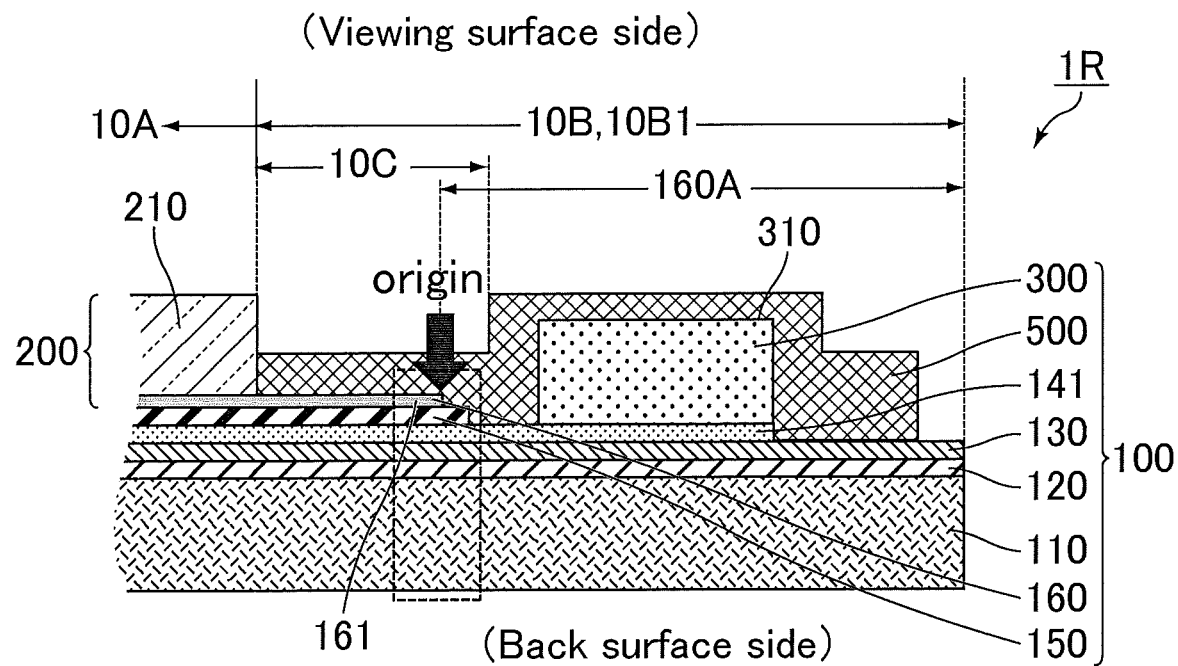
FIG. 15 is a schematic cross-sectional view of a frame region in a liquid crystal display device of a comparative embodiment in a state where a moisture-proof resin film of the liquid crystal display device is cracked.
Figure 16:
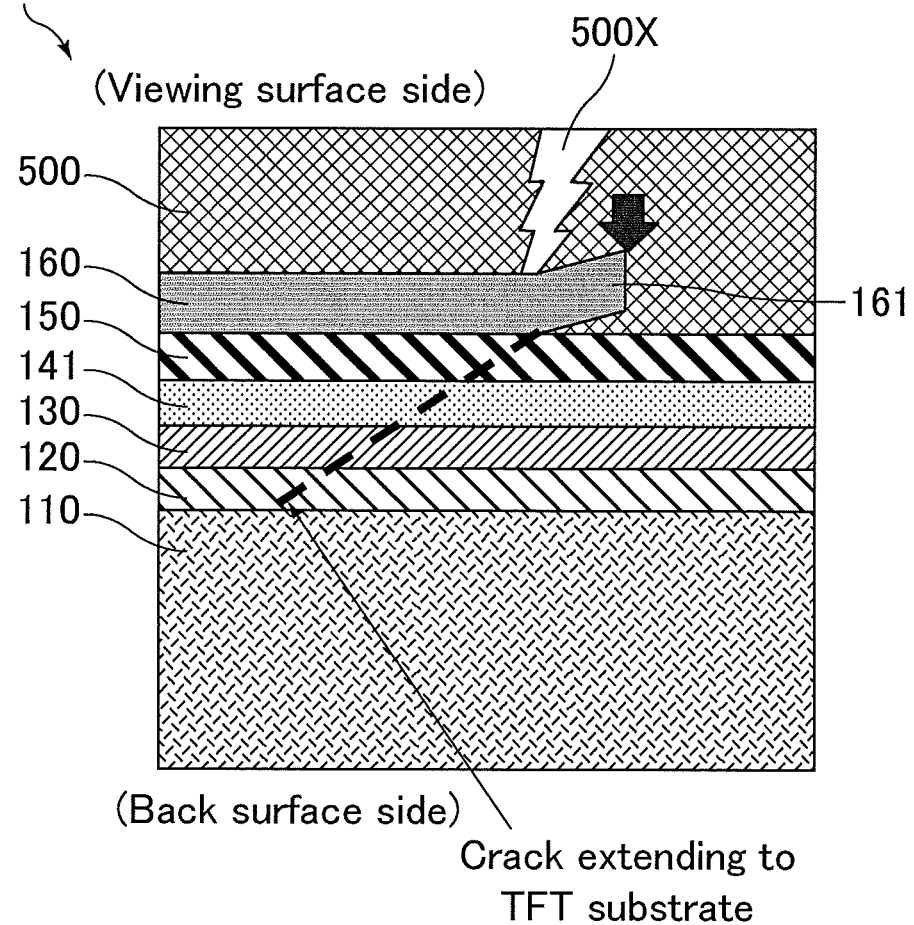
FIG. 16 is an enlarged schematic cross-sectional view of the region surrounded by the dotted line in FIG. 15.
Figure 17:
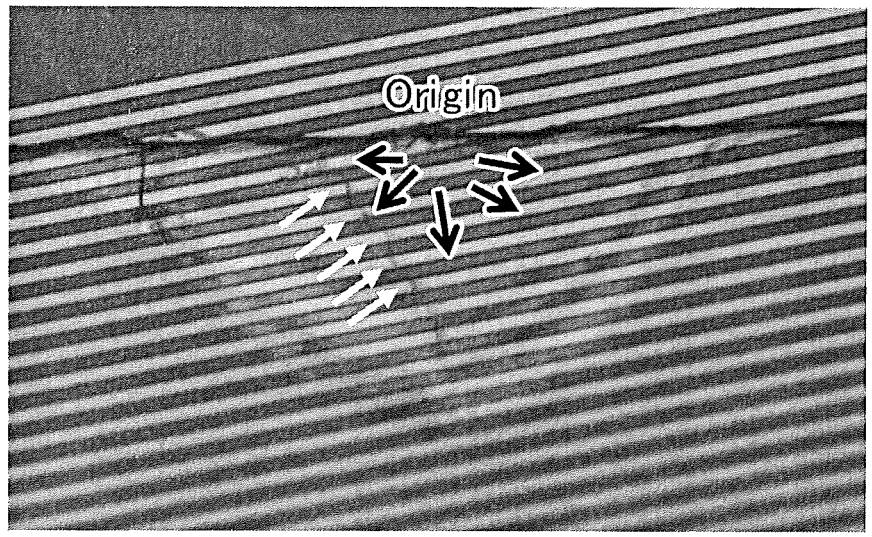
FIG. 17 is a photograph showing the state where conductive lines in the liquid crystal display device of the comparative embodiment are short-circuited.

FIG. 14 is a view showing a temperature distribution in a source driver of a liquid crystal display device of Example 2. The liquid crystal display device of Example 2 is the liquid crystal display device of Modified Example 1 of Embodiment 1 utilizing an acrylic resin film as the organic protective film 160, epoxy-based resin films as the anisotropic conductive films 400, and a styrene-butadiene-based resin film as the moisture-proof resin film 500. The thickness of the liquid crystal panel in the liquid crystal display device of Example 2 was 0.2 mm.

The source drivers of the liquid crystal display device of Example 2 were driven at an environmental temperature of 85° C. for one hour, and the temperature distribution of the source drivers was determined with the backlight turned on. The results shown in FIG. 14 were obtained. As shown in FIG. 14, the increase in temperature near the center of each source driver was significant, and the temperature increase was reduced toward the edge. The temperature at a first point P1 near the center of the top surface of the source driver was 98.1° C., while the temperature at a second point P2 near the edge of the top surface of the source driver was 92.7° C.

The region with a temperature resulting from subtracting 4 or less degrees from the highest temperature near the center is preferably not covered with the moisture-proof resin film for a better heat dissipation effect because such a temperature is still high. The results in FIG. 14 show that this region includes the center of the top surface 310 of each source driver 300 in the direction 10X and occupies 60% or more of the area of the entire top surface 310 of the source driver 300.

REFERENCE SIGNS LIST 1, 1R: liquid crystal display device
2: organic EL display device 10A: display region
10B: frame region
10B1: extension region
10C: region
10D: diagonally front region
10DX1, 10DX2, 10DY1, 10DY2, 300X, 300Y: end
10X: orthogonal direction
10Y: direction toward display region
100: TFT substrate
110, 210: insulating substrate
120: basecoat film
130: gate insulator
141: source line
142: gate line
143: TFT
144: pixel electrode
150: inorganic film
161: end
160: organic protective film
160A: exterior region
200: CF substrate
200E: sealing substrate
300: source driver
310: top surface
311: portion not covered
320, 370: surface facing display region
350: gate driver
400: anisotropic conductive film
500: moisture-proof resin film
500X: crack
600: heat dissipation sheet
610: first end
620: second end
700: metal chassis
800: flexible printed circuit
900: printed wired board
1410: bypass source line
P1: first point
P2: second point

What is claimed is:

1. A display device configured to display an image in a display region, comprising:
an insulating substrate;
conductive lines provided on the insulating substrate and extending from the display region to a frame region exterior to the display region;
a driver provided in the frame region and connected to the conductive lines;
an organic protective film overlapping the conductive lines and extending from the display region to a region between the display region and the driver;
an anisotropic conductive film provided under the driver and covering an end of the organic protective film between the display region and the driver; and
a moisture-proof resin film overlapping the anisotropic conductive film and covering the end of the organic protective film between the display region and the driver.

2. The display device according to claim 1,
wherein the organic protective film is an acrylic resin film,
the anisotropic conductive film is an epoxy-based resin film, and
the moisture-proof resin film is a styrene-butadiene-based resin film.

3. The display device according to claim 1,
wherein the moisture-proof resin film does not cover at least part of a top surface of the driver.

4. The display device according to claim 3,
wherein the moisture-proof resin film does not cover 60% or more and 100% or less of an area of an entire top surface of the driver.

5. The display device according to claim 3, further comprising a heat dissipation sheet attached to a portion of the top surface of the driver not covered with the moisture-proof resin film.

6. The display device according to claim 1,
wherein with a direction from the driver to the display region being defined as a front direction,
the conductive lines include a conductive line that extends from the driver to the display region by bypassing a diagonally front region diagonally in front of the driver and overlapping the end of the organic protective film.

7. The display device according to claim 6,
wherein the driver is provided along the display region, and
the diagonally front region extends from a position 1.5 mm away from the driver to a position 2.5 mm away from the driver in a direction orthogonal to the direction from the driver to the display region.

8. The display device according to claim 6,
wherein the driver is provided along the display region, and
the diagonally front region extends from a position 0.5 mm away from the driver to a position 1.0 mm away from the driver in the direction from the driver to the display region.

9. The display device according to claim 1, further comprising an inorganic film between the conductive lines and the organic protective film,
wherein the inorganic film extends to an exterior region of the end of the organic protective film.

10. The display device according to claim 1,
wherein the display device is a liquid crystal display device.

11. The display device according to claim 1,
wherein the display device is an organic electroluminescent display device.

12. A display device configured to display an image in a display region, comprising:
an insulating substrate;
conductive lines provided on the insulating substrate and extending from the display region to a frame region exterior to the display region;
a driver provided in the frame region and connected to the conductive lines;
an organic protective film overlapping the conductive lines and extending from the display region to a region between the display region and the driver; and
a moisture-proof resin film covering an end of the organic protective film between the display region and the driver and not covering at least part of a top surface of the driver.

13. The display device according to claim 12,
wherein the moisture-proof resin film does not cover 60% or more and 100% or less of an area of an entire top surface of the driver.

14. The display device according to claim 12, further comprising a heat dissipation sheet attached to a portion of the top surface of the driver not covered with the moisture-proof resin film.

15. The display device according to claim 12,
wherein with a direction from the driver to the display region being defined as a front direction, the conductive lines include a conductive line that extends from the driver to the display region by bypassing a diagonally front region diagonally in front of the driver and overlapping the end of the organic protective film.

16. The display device according to claim 15, wherein the driver is provided along the display region, and the diagonally front region extends from a position 1.5 mm away from the driver to a position 2.5 mm away from the driver in a direction orthogonal to the direction from the driver to the display region.

17. The display device according to claim 15, wherein the driver is provided along the display region, and the diagonally front region extends from a position 0.5 mm away from the driver to a position 1.0 mm away from the driver in the direction from the driver to the display region.

18. The display device according to claim 12, further comprising an inorganic film between the conductive lines and the organic protective film, wherein the inorganic film extends to an exterior region of the end of the organic protective film.

19. A display device configured to display an image in a display region, comprising:

an insulating substrate;

conductive lines provided on the insulating substrate and extending from the display region to a frame region exterior to the display region;

a driver provided in the frame region and connected to the conductive lines;

an organic protective film overlapping the conductive lines and extending from the display region to a region between the display region and the driver; and a moisture-proof resin film covering an end of the organic protective film between the display region and the driver, wherein with a direction from the driver to the display region being defined as a front direction, the conductive lines include a conductive line that extends from the driver to the display region by bypassing a diagonally front region diagonally in front of the driver and overlapping the end of the organic protective film.

20. The display device according to claim 19, wherein the driver is provided along the display region, and the diagonally front region extends from a position 1.5 mm away from the driver to a position 2.5 mm away from the driver in a direction orthogonal to the direction from the driver to the display region.

21. The display device according to claim 20, wherein the driver is provided along the display region, and the diagonally front region extends from a position 0.5 mm away from the driver to a position 1.0 mm away from the driver in the direction from the driver to the display region.

22. The display device according to claim 19, further comprising an inorganic film between the conductive lines and the organic protective film, wherein the inorganic film extends to an exterior region of the end of the organic protective film.

\* \* \* \* \*